(12) United States Patent
Liu

(10) Patent No.: US 11,056,454 B2
(45) Date of Patent: Jul. 6, 2021

(54) STACKED THREE-DIMENSIONAL HETEROGENEOUS MEMORY DEVICES AND METHODS FOR FORMING THE SAME

(71) Applicant: YANGTZE MEMORY TECHNOLOGIES CO., LTD., Wuhan (CN)

(72) Inventor: Jun Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 75 days.

(21) Appl. No.: 16/727,889

(22) Filed: Dec. 26, 2019

(65) Prior Publication Data

US 2020/0328176 A1    Oct. 15, 2020

Related U.S. Application Data

(63) Continuation of application No. PCT/CN2019/115664, filed on Nov. 5, 2019.

(30) Foreign Application Priority Data

Apr. 15, 2019  (WO) ................ PCT/CN2019/082607

(51) Int. Cl.
*H01L 23/00* (2006.01)
*H01L 27/108* (2006.01)
(Continued)

(52) U.S. Cl.
CPC .............. *H01L 24/29* (2013.01); *H01L 24/83* (2013.01); *H01L 27/10814* (2013.01);
(Continued)

(58) Field of Classification Search
CPC .............. H01L 25/0657; H01L 27/108; H01L 27/10805; H01L 27/10814;
(Continued)

(56) References Cited

U.S. PATENT DOCUMENTS 10,134,712 B1 *  11/2018  Veches ................... H01L 25/50
2018/0366453 A1   12/2018  Carlson et al.
(Continued)

FOREIGN PATENT DOCUMENTS

| CN | 105789069 A | 7/2016 |
|---|---|---|
| CN | 108573959 A | 9/2018 |

(Continued)

OTHER PUBLICATIONS

International Search Report issued in corresponding International Application No. PCT/CN2019/115664, dated Feb. 12, 2020, 4 pages.

(Continued)

*Primary Examiner* — Allison Bernstein
(74) *Attorney, Agent, or Firm* — Bayes PLLC

(57) ABSTRACT

Embodiments of three-dimensional (3D) memory devices and fabrication methods thereof are disclosed. In an example, a 3D memory device includes NAND memory cells and a first bonding layer including first bonding contacts. The 3D memory device also includes a second semiconductor structure including DRAM cells and a second bonding layer including second bonding contacts. The 3D memory device also includes a third semiconductor structure including SRAM cells, a third bonding layer including third bonding contacts, and a fourth bonding layer including fourth bonding contacts. The third and fourth bonding layers are on both sides of the SRAM cells. The semiconductor device further includes a first bonding interface between the first and third bonding layers. The first bonding contacts are in contact with the third bonding contacts at the first bonding interface. The 3D memory device further includes a second bonding interface between the second and fourth bonding (Continued)

layers. The second bonding contacts are in contact with the fourth bonding contacts at the second bonding interface.

20 Claims, 23 Drawing Sheets

(51) Int. Cl.
| | | |
|---|---|---|
| H01L 27/11 | (2006.01) | |
| H01L 27/11524 | (2017.01) | |
| H01L 27/11529 | (2017.01) | |
| H01L 27/11556 | (2017.01) | |
| H01L 27/1157 | (2017.01) | |
| H01L 27/11573 | (2017.01) | |
| H01L 27/11582 | (2017.01) | |

(52) U.S. Cl.
CPC .. *H01L 27/10847* (2013.01); *H01L 27/10897* (2013.01); *H01L 27/1104* (2013.01); *H01L 27/1116* (2013.01); *H01L 27/1157* (2013.01); *H01L 27/11524* (2013.01); *H01L 27/11529* (2013.01); *H01L 27/11556* (2013.01); *H01L 27/11573* (2013.01); *H01L 27/11582* (2013.01)

(58) Field of Classification Search
CPC ............... H01L 27/10847; H01L 27/11; H01L 27/1104; H01L 27/1108; H01L 27/1112; H01L 27/11524; H01L 27/11529; H01L 27/1157; H01L 24/29; H01L 24/83
See application file for complete search history.

(56) References Cited

U.S. PATENT DOCUMENTS

| | | | |
|---|---|---|---|
| 2019/0163650 A1 | 5/2019 | Kim et al. | |
| 2020/0328180 A1* | 10/2020 | Cheng | ..................... H01L 25/18 |
| 2020/0328181 A1* | 10/2020 | Liu | ......................... H01L 21/78 |

FOREIGN PATENT DOCUMENTS

| | | |
|---|---|---|
| CN | 109148498 A | 1/2019 |
| CN | 109155301 A | 1/2019 |
| CN | 109155320 A | 1/2019 |
| CN | 109314116 A | 2/2019 |
| CN | 109390305 A | 2/2019 |
| CN | 109411473 A | 3/2019 |
| CN | 109417075 A | 3/2019 |
| CN | 109524412 A | 3/2019 |
| TW | 201913966 A | 4/2019 |
| TW | 201914039 A | 4/2019 |
| TW | 201933578 A | 8/2019 |
| TW | 201935631 A | 9/2019 |

OTHER PUBLICATIONS

Witten Opinion of the International Searching Authority issued in corresponding International Application No. PCT/CN2019/115664, mailed Feb. 12, 2020, 5 pages.

* cited by examiner

100

200

300

400

601

603

605

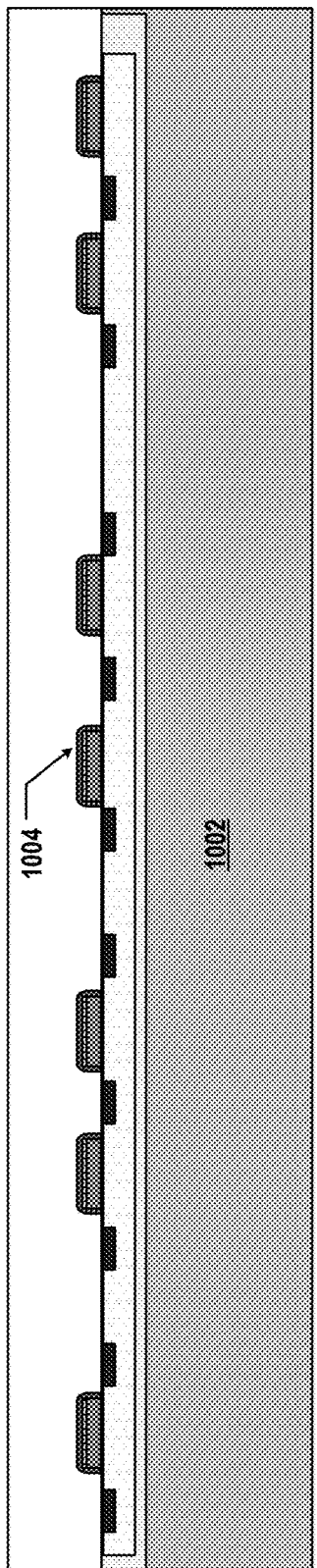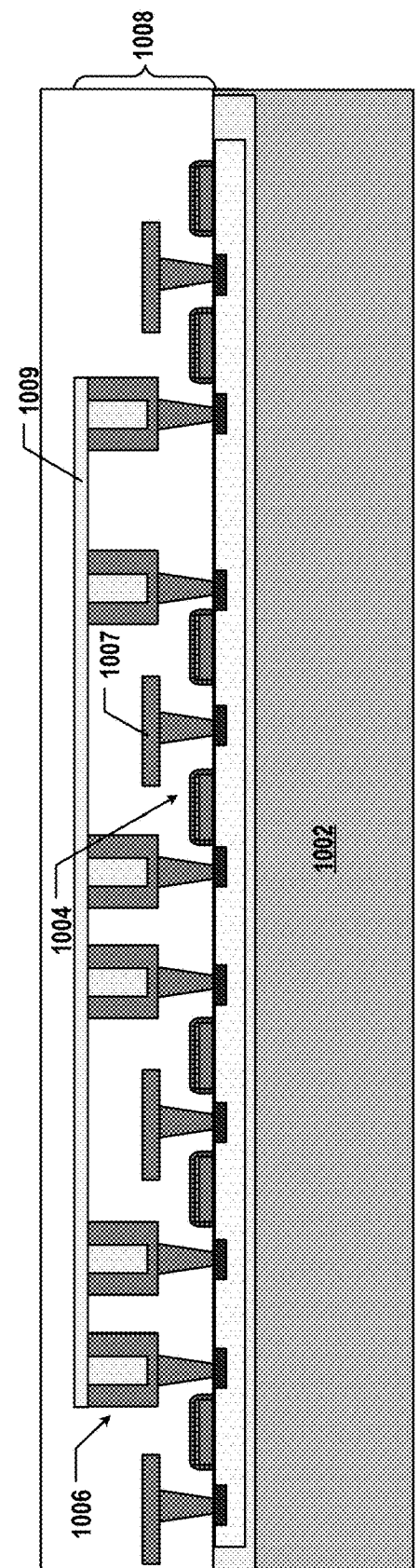

STACKED THREE-DIMENSIONAL HETEROGENEOUS MEMORY DEVICES AND METHODS FOR FORMING THE SAME

CROSS-REFERENCE TO RELATED APPLICATIONS

This application is continuation of International Application No. PCT/CN2019/115664, filed on Nov. 5, 2019, entitled "STACKED THREE-DIMENSIONAL HETEROGENEOUS MEMORY DEVICES AND METHODS FOR FORMING THE SAME," which claims the benefit of priority to International Application No. PCT/CN2019/082607, filed on Apr. 15, 2019, entitled "INTEGRATION OF THREE-DIMENSIONAL NAND MEMORY DEVICES WITH MULTIPLE FUNCTIONAL CHIPS," all of which are incorporated herein by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. 3D memory architecture includes a memory array and peripheral devices for controlling signals to and from the memory array.

SUMMARY

Embodiments of 3D memory devices and fabrication methods thereof are disclosed herein.

In one example, a 3D memory device includes a first semiconductor structure including an array of NAND memory cells and a first bonding layer including a plurality of first bonding contacts. The 3D memory device also includes a second semiconductor structure including an array of DRAM cells and a second bonding layer including a plurality of second bonding contacts. The 3D memory device also includes a third semiconductor structure including an array of static random-access memory (SRAM) cells, a third bonding layer including a plurality of third bonding contacts, and a fourth bonding layer including a plurality of fourth bonding contacts. The third bonding layer and the fourth bonding layer are on both sides of the array of SRAM cells. The 3D memory device further includes a first bonding interface between the first bonding layer and the third bonding layer. The first bonding contacts are in contact with the third bonding contacts at the first bonding interface. The 3D memory device further includes a second bonding interface between the second bonding layer and the fourth bonding layer. The second bonding contacts are in contact with the fourth bonding contacts at the second bonding interface.

In another example, a 3D memory device includes a first semiconductor structure including an array of SRAM cells and a first bonding layer including a plurality of first bonding contacts. The 3D memory device also includes a second semiconductor structure including an array of DRAM cells and a second bonding layer including a plurality of second bonding contacts. The 3D memory device also includes a third semiconductor structure including an array of NAND memory cells, a third bonding layer including a plurality of third bonding contacts, and a fourth bonding layer including a plurality of fourth bonding contacts. The third bonding layer and the fourth bonding layer are on both sides of the array of NAND memory cells. The 3D memory device further includes a first bonding interface between the first bonding layer and the third bonding layer. The first bonding contacts are in contact with the third bonding contacts at the first bonding interface. The 3D memory device further includes a second bonding interface between the second bonding layer and the fourth bonding layer. The second bonding contacts are in contact with the fourth bonding contacts at the second bonding interface.

In still another example, a method for forming a 3D memory device is disclosed. A first semiconductor structure including an array of NAND memory cells and a first bonding layer including a plurality of first bonding contacts is formed. A second semiconductor structure including an array of DRAM cells and a second bonding layer including a plurality of second bonding contacts is formed. A third semiconductor structure including an array of SRAM cells and a third bonding layer including a plurality of third bonding contacts is formed. The third semiconductor structure and one of the first and second semiconductor structures are bonded in a face-to-face manner to form a bonded structure having a first bonding interface between the third bonding layer and one of the first and second bonding layers. A fourth bonding layer including a plurality of fourth bonding contacts is formed in the third semiconductor structure. The third bonding layer and the fourth bonding layer are on both sides of the array of SRAM cells. The bonded structure and another one of the first and second semiconductor structures are bonded in a face-to-face manner to form a second bonding interface between the fourth bonding layer and another one of the first and second bonding layers.

In yet another example, a method for forming a 3D memory device is disclosed. A first semiconductor structure including an array of SRAM cells and a first bonding layer including a plurality of first bonding contacts is formed. A second semiconductor structure including an array of DRAM cells and a second bonding layer including a plurality of second bonding contacts is formed. A third semiconductor structure including an array of NAND memory cells and a third bonding layer including a plurality of third bonding contacts is formed. The third semiconductor structure and one of the first and second semiconductor structures are bonded in a face-to-face manner to form a bonded structure having a first bonding interface between the third bonding layer and one of the first and second bonding layers. A fourth bonding layer including a plurality of fourth bonding contacts is formed in the third semiconductor structure. The third bonding layer and the fourth bonding layer are on both sides of the array of NAND memory cells. The bonded structure and another one of the first and second semiconductor structures are bonded in a face-to-face manner to form a second bonding interface between the fourth bonding layer and another one of the first and second bonding layers.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 10A-10C illustrate a fabrication process for forming an exemplary semiconductor structure having DRAM cells, according to some embodiments.

Figure 1:
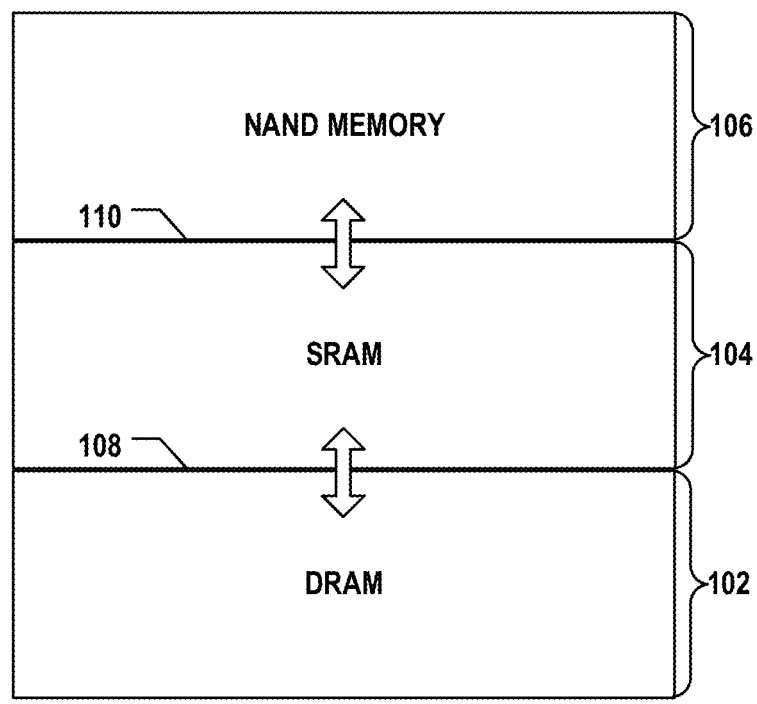
FIG. 1 illustrates a schematic view of a cross-section of an exemplary 3D memory device having heterogeneous memories, according to some embodiments.
Figure 1:
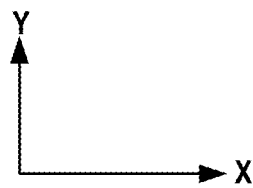

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiments. Further, when a particular feature, structure or characteristic is described in connection with an embodiment, it would be within the knowledge of a person skilled in the pertinent art to affect such features, structures or characteristics in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "three-dimensional (3D) NAND memory string" refers to a vertically-oriented string of memory cell transistors connected in series on a laterally-oriented substrate so that the string of memory cell transistors extends in the vertical direction with respect to the substrate. As used herein, the term "vertical/vertically" means nominally perpendicular to the lateral surface of a substrate.

The conventional memory device is usually homogeneous, i.e., having the same type of memory. For example, the main memory is either NAND memory or DRAM. Even for a memory device in a multi-chip package (MCP), the same type of memory dies, e.g., NAND dies or DRAM dies, are included in the same package. However, when different types of memories are needed, multiple memory chips (in separate packages) soldered onto a printed circuit board (PCB) and electrically connected through long-distance metal wires/lines on the PCB are necessary, thereby causing further resistive-capacitive (RC) delay and increasing PCB area.

On the other hand, 3D integration of memory device is either achieved at a package level, such as by stacking separately manufactured chips in an MCP, or at the memory cell level. A monolithic 3D approach offers higher interlayer connect density, allowing 3D memory devices to be constructed at the memory cell level (e.g., transistors) with a tighter cell density. Generally, a monolithic 3D memory device entails two or more levels of memory cells that are sequentially fabricated and interconnected over a substrate. However, the monolithic 3D memory device has a high manufacturing cost with a long cycle time as the memory cells are formed stack by stack. The interactive impacts with incoming layers and/or stacks, in particular the thermal budget influence and limitation, can introduce undesired characteristics, such as non-uniformity, unsatisfying profile, defects, stress, etc. Moreover, data transfer and processing rate is slow at the system level, especially due to long-distance interlayer electrical connections and unsatisfying interconnects.

Various embodiments in accordance with the present disclosure provide a stacked 3D memory device having heterogeneous memories (e.g., SRAM, DRAM., and NAND memories) bonded together to achieve lower manufacturing cost with shorter cycle time and higher yield, shorter distance of interlayer electrical connections, and better array efficiency with smaller die size and bit cost, compared with monolithic 3D memory devices. The heterogeneous memory architecture can utilize the advantages of both non-volatile memory and volatile memory, for example, the large storage capacity of NAND memory and the fast access speed of SRAM and DRAM, thereby broadening the process window for circuit design.

In some embodiments, the semiconductor device disclosed herein can include heterogeneous memories, such as a first semiconductor structure having NAND memory (e.g., as non-volatile memory), a second semiconductor structure having DRAM (e.g., as volatile memory), and a third semiconductor structure having SRAM (e.g., as on-chip cache) bonded one over another (e.g., using hybrid bonding) with a large number of short-distance vertical metal interconnects through the two bonding interfaces instead of the peripherally-distributed, long-distance metal routing, or even conventional through silicon vias (TSVs). As a result, shorter manufacturing cycle time with higher yield can be achieved due to less interactive influences from manufacturing processes of the SRAM wafer, the NAND memory wafer, and the DRAM wafer, as well as the known good hybrid bonding yield. The shorter connection distance between the SRAM, NAND memory, and DRAM, such as from millimeter or centimeter-level to micrometer-level, can improve the memory performance with faster data transfer rate.

FIG. 1 illustrates a schematic view of a cross-section of an exemplary 3D memory device 100 having heterogeneous memories, according to some embodiments. 3D memory device 100 represents an example of a bonded semiconductor device. The components of 3D memory device 100 (e.g., SRAM, NAND memory, and DRAM) can be formed separately on different substrates and then joined together to form a bonded chip in which three different types of memories are stacked one over another.

3D memory device 100 can also include a first semiconductor structure 102 including an array of DRAM cells. That is, first semiconductor structure 102 can be a DRAM memory device. DRAM requires periodic refreshing of the memory cells. In some embodiments, each DRAM cell includes a capacitor for storing a bit of data as a positive or negative electrical charge as well as one or more transistors that control access to it. In one example, each DRAM cell is a one-transistor, one-capacitor (1T1C) cell.

3D memory device 100 can also include a second semiconductor structure 104 including an array of SRAM cells. In some embodiments, the SRAM cell array in second semiconductor structure 104 uses complementary metaloxide-semiconductor (CMOS) technology. The SRAM cell array can be implemented with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.) to achieve high speed. In some embodiments, each SRAM cell includes a plurality of transistors for storing a bit of data as a positive or negative electrical charge as well as one or more transistors that control access to it. In one example, each SRAM cell has six transistors (e.g., metal-oxide-semiconductor field-effect transistors (MOSFETs)), for example, four transistors for storing a bit of data and two transistors for controlling access to the data. The SRAM can be used as one or more caches (e.g., instruction cache or data cache) and/or data buffers.

In some embodiments, second semiconductor structure 104 of 3D memory device 100 further includes the entirety or part of the peripheral circuits of the DRAM in first semiconductor structure 102. The peripheral circuits (also known as control and sensing circuits) can include any suitable digital, analog, and/or mixed-signal circuits used for facilitating the operations of the DRAM. For example, the peripheral circuits can include one or more of an input/output buffer, a decoder (e.g., a row decoder and a column decoder), a sense amplifier, or any active or passive components of the circuit (e.g., transistors, diodes, resistors, or capacitors). In some embodiments, second semiconductor structure 104 of 3D memory device 100 further includes the entirety or part of the peripheral circuits of the NAND memory in third semiconductor structure 106. The peripheral circuit (also known as control and sensing circuits) can include any suitable digital, analog, and/or mixed-signal circuits used for facilitating the operations of the NAND memory. For example, the peripheral circuit can include one or more of a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). The memory controller of the SRAM can be embedded as part of the peripheral circuits.

3D memory device 100 can further include a third semiconductor structure 106 including an array of NAND memory cells. That is, third semiconductor structure 106 can be a NAND flash memory device in which memory cells are provided in the form of an array of 3D NAND memory strings and/or an array of 2D NAND memory cells. NAND memory cells can be organized into pages which are then organized into blocks in which each NAND memory cell is electrically connected to a separate line called a bit line (BL). All memory cells with the same vertical position in the NAND memory cell can be electrically connected through the control gates by a word line (WL). In some embodiments, a memory plane contains a certain number of blocks that are electrically connected through the same bit line.

In some embodiments, the array of NAND memory cells is an array of 2D NAND memory cells, each of which includes floating-gate transistors. The array of 2D NAND memory cells includes a plurality of 2D NAND memory strings, each of which includes a plurality of memory cells (e.g., 32 to 128 memory cells) connected in series (resembling a NAND gate) and two select transistors, according to some embodiments. Each 2D NAND memory string is arranged in the same plane on the substrate (in 2D), according to some embodiments. In some embodiments, the array of NAND memory cells is an array of 3D NAND memory strings, each of which extends vertically above the substrate (in 3D) through a memory stack. Depending on the 3D NAND technology (e.g., the number of layers/tiers in the memory stack), a 3D NAND memory string typically includes 32 to 256 NAND memory cells, each of which includes a floating-gate transistor or a charge-trap transistor As shown in FIG. 1, 3D memory device 100 further includes a first bonding interface 108 vertically between first semiconductor structure 102 and second semiconductor structure 104, and a second bonding interface 110 vertically between second semiconductor structure 104 and third semiconductor structure 106. First bonding interface 108 and second bonding interface 110 are in different planes, according to some embodiments. For example, first bonding interface 108 may be below second bonding interface 110 as shown in FIG. 1. That is, in some embodiments, first, second, and third semiconductor structure 102, 104, and 106 are stacked one over another. For example, third semiconductor structure 106 may be above second semiconductor structure 104, which may be above first semiconductor structure 102, as shown in FIG. 1.

As described below in detail, first, second, and third semiconductor structures 102, 104, and 106 can be fabricated separately (and in parallel in some embodiments) such that the thermal budget of fabricating one of first, second, and third semiconductor structures 102, 104, and 106 does not limit the processes of fabricating another one of first, second, and third semiconductor structures 102, 104, and 106. Moreover, a large number of interconnects (e.g., bonding contacts) can be formed through first and second bonding interfaces 108 and 110 to make direct, short-distance (e.g., micron-level) electrical connections between first and second semiconductor structures 102 and 104 and between second and third semiconductor structures 104 and 106, respectively, as opposed to the long-distance (e.g., millimeter or centimeter-level) chip-to-chip data bus on the circuit board, such as PCB, thereby eliminating chip interface delay and achieving high-speed I/O throughput with reduced power consumption. Data transfer between the DRAM in first semiconductor structure 102 and the SRAM in second semiconductor structure 104 can be performed through the interconnects (e.g., bonding contacts) across first bonding interface 108. Similarly, data transfer between the SRAM in second semiconductor structure 104 and the NAND memory in third semiconductor structure 106 can be performed through the interconnects (e.g., bonding contacts) across second bonding interface 110. By vertically integrating first, second, and third semiconductor structures 102, 104, and 106 having heterogeneous memories, the memory chip size can be reduced, and the memory cell density can be increased.

Figure 2:
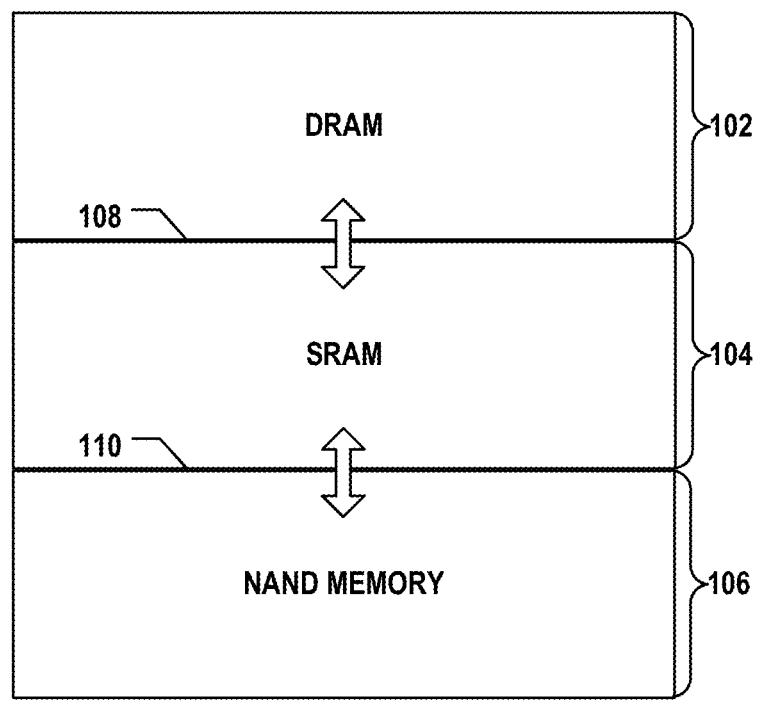
FIG. 2 illustrates a schematic view of a cross-section of another exemplary 3D memory device having heterogeneous memories, according to some embodiments.
Figure 2:
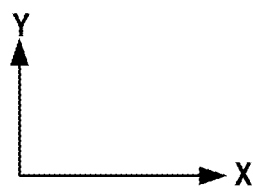

It is understood that the relative positions of heterogeneous memories stacked in first, second, and third semiconductor structures 102, 104, and 106 are not limited to the example in FIG. 1. FIG. 2 illustrates a schematic view of a cross-section of another exemplary 3D memory device 200, according to some embodiments. Different from 3D memory device 100 in FIG. 1 in which third semiconductor structure 106 including NAND memory is above second semiconductor structure 104 including SRAM, which is above first semiconductor structure 102 including DRAM, in 3D memory device 200 in FIG. 2, first semiconductor structure 102 is above second semiconductor structure 104, which is above third semiconductor structure 106. Nevertheless, first bonding interface 108 is formed vertically between first and second semiconductor structures 102 and 104 in 3D memory device 200, and first and second semiconductor structures 102 and 104 are joined vertically through bonding (e.g., hybrid bonding), according to some embodiments. Similarly, second bonding interface 110 is formed vertically between second and third semiconductor structures 104 and 106 in 3D memory device 200, and second and third semiconductor structures 104 and 106 are joined vertically through bonding (e.g., hybrid bonding), according to some embodiments. Different from the example in FIG. 1 in which second bonding interface 110 is above first bonding interface 108, in 3D memory device 200 first bonding interface 108 is above second bonding interface 110. Data transfer between the DRAM in first semiconductor structure 102 and the SRAM in second semiconductor structure 104 can be performed through the interconnects (e.g., bonding contacts) across first bonding interface 108. Similarly, data transfer between the SRAM in second semiconductor structure 104 and the NAND memory in third semiconductor structure 106 can be performed through the interconnects (e.g., bonding contacts) across second bonding interface 110.

Although in FIGS. 1 and 2, second semiconductor structure 104 including SRAM is in the middle of three semiconductor structures 102, 104 and 106, i.e., sandwiched between first semiconductor structure 102 including DRAM and third semiconductor structure 106 including NAND memory, it is understood that third semiconductor structure 106 including NAND memory may be in the middle of three semiconductor structures 102, 104 and 106 in some other embodiments.

Figure 3:
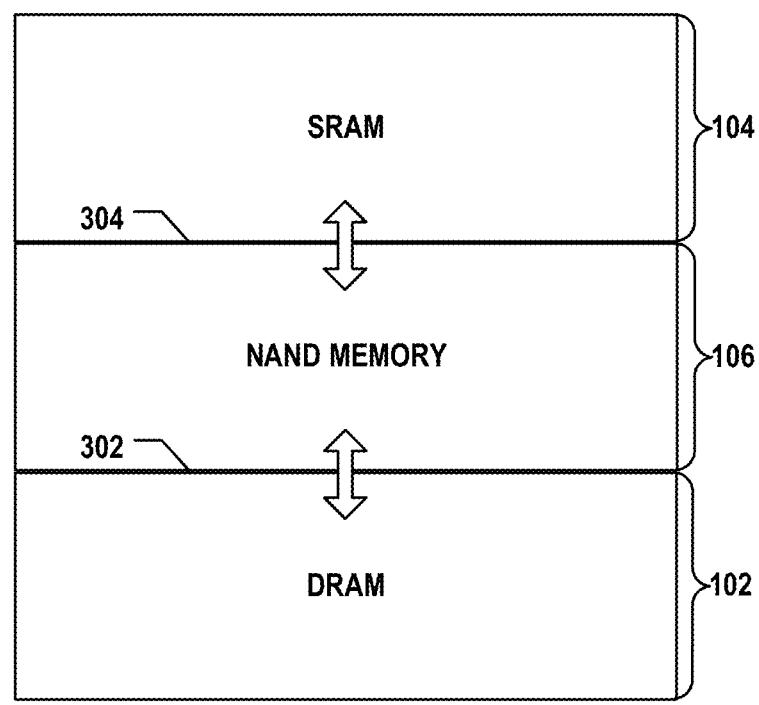
FIG. 3 illustrates a schematic view of a cross-section of still another exemplary 3D memory device having heterogeneous memories, according to some embodiments.
Figure 3:
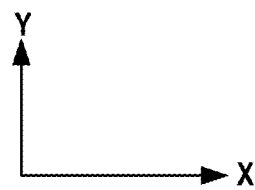

For example, FIG. 3 illustrates a schematic view of a cross-section of still another exemplary 3D memory device 300, according to some embodiments. As shown in FIG. 3, second semiconductor structure 104 including SRAM is above third semiconductor structure 106 including NAND memory, which is above first semiconductor structure 102 including DRAM. A first bonding interface 302 is formed vertically between first and third semiconductor structures 102 and 106 in 3D memory device 300, and first and third semiconductor structures 102 and 106 are joined vertically through bonding (e.g., hybrid bonding), according to some embodiments. Similarly, a second bonding interface 304 is formed vertically between second and third semiconductor structures 104 and 106 in 3D memory device 300, and second and third semiconductor structures 104 and 106 are joined vertically through bonding (e.g., hybrid bonding), according to some embodiments. First and second bonding interfaces 302 and 304 are in different planes, according to some embodiments. For example, second bonding interface 304 may be above first bonding interface 302 as shown in FIG. 3. Data transfer between the DRAM in first semiconductor structure 102 and the NAND memory in third semiconductor structure 106 can be performed through the interconnects (e.g., bonding contacts) across first bonding interface 302. Similarly, data transfer between the SRAM in second semiconductor structure 104 and the NAND memory in third semiconductor structure 106 can be performed through the interconnects (e.g., bonding contacts) across second bonding interface 304.

Figure 4:
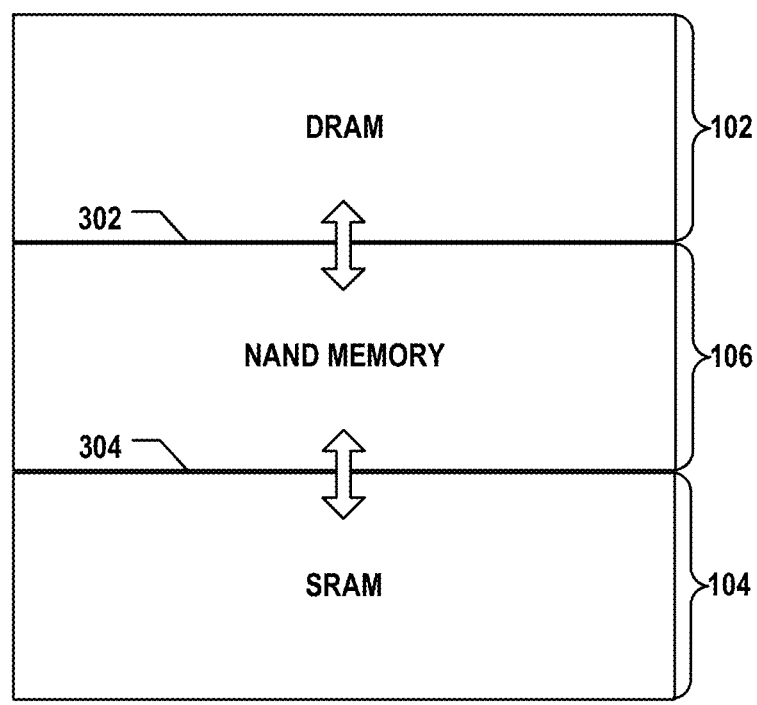
FIG. 4 illustrates a schematic view of a cross-section of yet another exemplary 3D memory device having heterogeneous memories, according to some embodiments.
Figure 4:
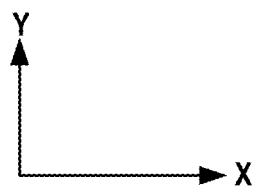

FIG. 4 illustrates a schematic view of a cross-section of yet another exemplary 3D memory device 400, according to some embodiments. As shown in FIG. 4, first semiconductor structure 102 including DRAM is above third semiconductor structure 106 including NAND memory, which is above second semiconductor structure 104 including SRAM. First bonding interface 302 is formed vertically between first and third semiconductor structures 102 and 106 in 3D memory device 400, and first and third semiconductor structures 102 and 106 are joined vertically through bonding (e.g., hybrid bonding), according to some embodiments. Similarly, second bonding interface 304 is formed vertically between second and third semiconductor structures 104 and 106 in 3D memory device 400, and second and third semiconductor structures 104 and 106 are joined vertically through bonding (e.g., hybrid bonding), according to some embodiments. First and second bonding interfaces 302 and 304 are in different planes, according to some embodiments. For example, first bonding interface 302 may be above second bonding interface 304 as shown in FIG. 4. Data transfer between the DRAM in first semiconductor structure 102 and the NAND memory in third semiconductor structure 106 can be performed through the interconnects (e.g., bonding contacts) across first bonding interface 302. Similarly, data transfer between the SRAM in second semiconductor structure 104 and the NAND memory in third semiconductor structure 106 can be performed through the interconnects (e.g., bonding contacts) across second bonding interface 304. In some embodiments, 3D memory devices 100, 200, 300, and 400 do not include a processor, such as a central processing unit (CPU).

Figure 5A:
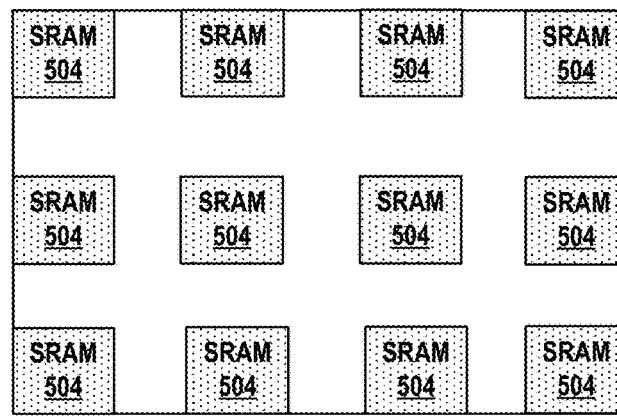
FIG. 5A illustrates a schematic plan view of an exemplary semiconductor structure having SRAM, according to some embodiments.

FIG. 5A illustrates a schematic plan view of an exemplary semiconductor structure 501 having SRAM, according to some embodiments. Semiconductor structure 501 may be one example of second semiconductor structure 104 in FIGS. 1-4. Semiconductor structure 501 can include SRAM 504 fabricated using the logic process. For example, FIG. 5A shows an exemplary layout of SRAM 504 in which the array of SRAM cells is distributed in a plurality of separate regions in semiconductor structure 501. That is, the cache module formed by SRAM 504 can be divided into smaller cache regions, distributing in semiconductor structure 501. In one example, the distribution of the cache regions may be based on the design of the bonding contacts, e.g., occupying the areas without bonding contacts. In another example, the distribution of the cache regions may be random. In some embodiments, semiconductor structure 501 includes only SRAM 504 without any peripheral circuits and other logic devices, e.g., a processor core.

Figure 5B:
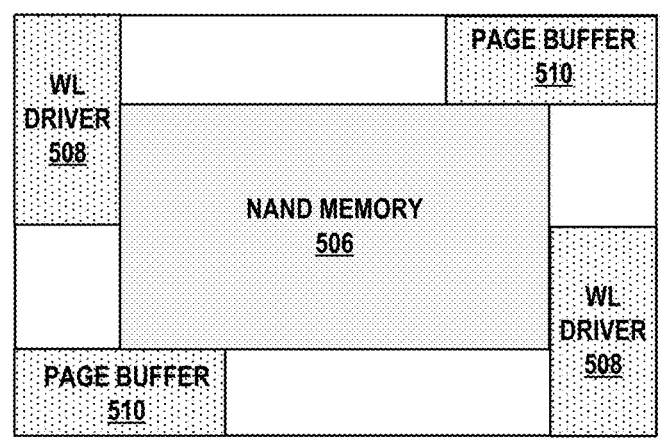
FIG. 5B illustrates a schematic plan view of an exemplary semiconductor structure having NAND memory and peripheral circuits, according to some embodiments.

FIG. 5B illustrates a schematic plan view of an exemplary semiconductor structure 503 having NAND memory and peripheral circuits, according to some embodiments. Semiconductor structure 503 may be one example of third semiconductor structure 106 in FIGS. 1-4. Semiconductor structure 503 can include NAND memory 506 on the same substrate as the peripheral circuits of NAND memory 506. Semiconductor structure 503 can include all the peripheral circuits for controlling and sensing NAND memory 506, including, for example, word line drivers 508, page buffers 510, and any other suitable devices. FIG. 5B shows an exemplary layout of the peripheral circuit (e.g., word line drivers 508, page buffers 510) and NAND memory 506 in which the peripheral circuit (e.g., word line drivers 508, page buffers 510) and NAND memory 506 are formed in different regions on the same plane. For example, the peripheral circuit (e.g., word line drivers 508, page buffers 510) may be formed outside NAND memory 506. It is understood that in some embodiments, the entirety or part of the peripheral circuits of SRAM 504 in semiconductor structure 501 may be in semiconductor structure 503 as well.

Figure 5C:
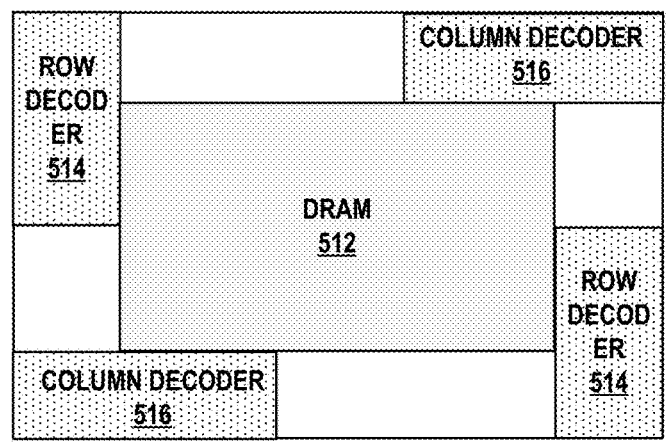
FIG. 5C illustrates a schematic plan view of an exemplary semiconductor structure having DRAM and peripheral circuits, according to some embodiments.

FIG. 5C illustrates a schematic plan view of an exemplary semiconductor structure 505 having DRAM and peripheral circuits, according to some embodiments. Semiconductor structure 505 may be one example of first semiconductor structure 102 in FIGS. 1-4. Semiconductor structure 505 can include DRAM 512 on the same substrate as the peripheral circuits of DRAM 512. Semiconductor structure 505 can include all the peripheral circuits for controlling and sensing DRAM 512, including, for example, row decoders 514, column decoders 516, and any other suitable devices. FIG. 5C shows an exemplary layout of the peripheral circuit (e.g., row decoders 514, column decoders 516) and DRAM 512 in which the peripheral circuit (e.g., row decoders 514, column decoders 516) and DRAM 512 are formed in different regions on the same plane. For example, the peripheral circuit (e.g., row decoders 514, column decoders 516) may be formed outside of DRAM 512. It is understood that in some embodiments, the entirety or part of the peripheral circuits of SRAM 504 in semiconductor structure 501 may be in semiconductor structure 505 as well.

It is understood that the layouts of semiconductor structures 501, 503, and 505 are not limited to the exemplary layouts in FIGS. 5A-5C. In some embodiments, part of the peripheral circuits of NAND memory 506 (e.g., one or more of word line drivers 508, page buffers 510, and any other suitable devices) may be in semiconductor structure 501 having SRAM 504. That is, the peripheral circuits of NAND memory 506 may be distributed on both semiconductor structures 501 and 503, according to some other embodiments. In some embodiments, part of the peripheral circuits of DRAM 512 (e.g., one or more of row decoders 514, column decoders 516, and any other suitable devices) may be in semiconductor structure 501 having SRAM 504. That is, the peripheral circuits of DRAM 512 may be distributed on both semiconductor structures 501 and 505, according to some other embodiments. In some embodiments, at least some of the peripheral circuits (e.g., word line drivers 508, page buffers 510) and NAND memory 506 (e.g., the array of NAND memory cells) are stacked one over another, i.e., in different planes. For example, NAND memory 506 (e.g., the array of NAND memory cells) may be formed above or below the peripheral circuits to further reduce the chip size. In some embodiments, at least some of the peripheral circuits (e.g., row decoders 514, column decoders 516) and DRAM 512 (e.g., the array of DRAM cells) are stacked one over another, i.e., in different planes. For example, DRAM 512 (e.g., the array of DRAM cells) may be formed above or below the peripheral circuits to further reduce the chip size.

Figure 6A:
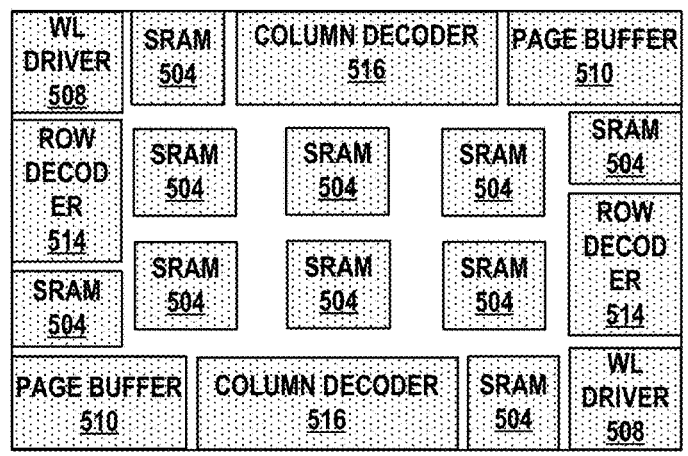
FIG. 6A illustrates a schematic plan view of an exemplary semiconductor structure having SRAM and peripheral circuits, according to some embodiments.

FIG. 6A illustrates a schematic plan view of an exemplary semiconductor structure 601 having SRAM and peripheral circuits, according to some embodiments. Semiconductor structure 601 may be one example of second semiconductor structure 104 in FIGS. 1-4. Semiconductor structure 601 can include SRAM 504 and the peripheral circuits of both NAND memory 506 and DRAM 512 (e.g., word line drivers 508, page buffers 510, row decoders 514, column decoders 516) fabricated using the same logic process. For example, FIG. 6A shows an exemplary layout of SRAM 504 in which the array of SRAM cells is distributed in a plurality of separate regions in semiconductor structure 601. Semiconductor structure 601 can include all the peripheral circuits for controlling and sensing NAND memory 506, including, for example, word line drivers 508, page buffers 510, and any other suitable devices. Semiconductor structure 601 can also include all the peripheral circuits for controlling and sensing DRAM 512, including, for example, row decoders 514, column decoders 516, and any other suitable devices. In some embodiments, semiconductor structure 601 may further include the peripheral circuits of SRAM 504. FIG. 6A shows an exemplary layout of the peripheral circuits (e.g., word line drivers 508, page buffers 510, row decoders 514, column decoders 516) in which the peripheral circuits and SRAM 504 are formed in different regions in the same plane. It is understood that in some embodiments, at least some of the peripheral circuits (e.g., word line drivers 508, page buffers 510, row decoders 514, column decoders 516) and SRAM 504 (e.g., the array of SRAM cells) are stacked one over another, i.e., in different planes. For example, SRAM 504 (e.g., the array of SRAM cells) may be formed above or below the peripheral circuits to further reduce the chip size.

Figure 6B:
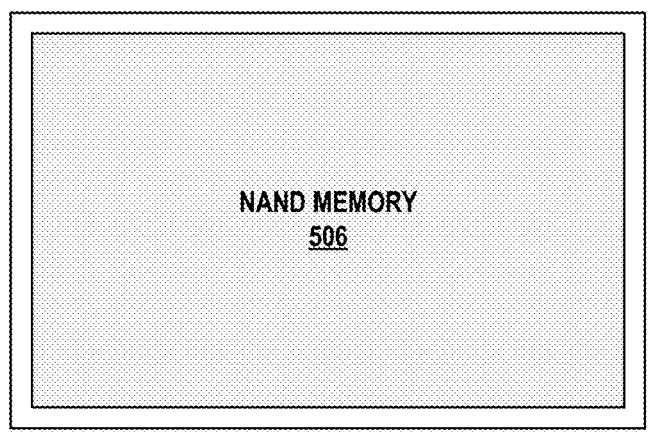
FIG. 6B illustrates a schematic plan view of an exemplary semiconductor structure having NAND memory, according to some embodiments.

FIG. 6B illustrates a schematic plan view of an exemplary semiconductor structure 603 having NAND memory, according to some embodiments. Semiconductor structure 603 may be one example of third semiconductor structure 106 in FIGS. 1-4. By moving all the peripheral circuits (e.g., word line drivers 508, page buffers 510) away from semiconductor structure 603 (e.g., to semiconductor structure 601), the size of NAND memory 506 (e.g., the number of NAND memory cells) in semiconductor structure 603 can be increased.

Figure 6C:
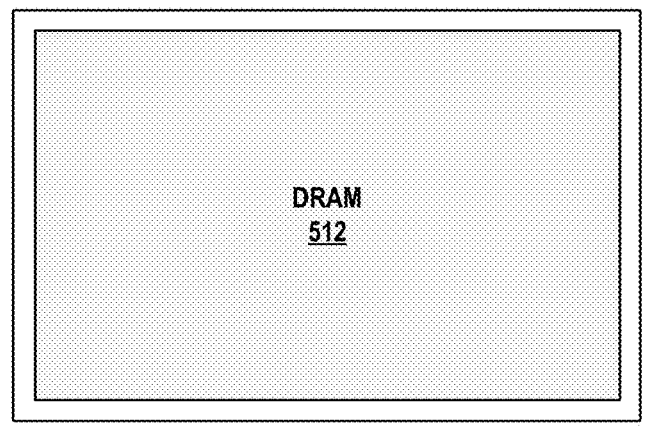
FIG. 6C illustrates a schematic plan view of an exemplary semiconductor structure having DRAM, according to some embodiments.

FIG. 6C illustrates a schematic plan view of an exemplary semiconductor structure 605 having DRAM, according to some embodiments. Semiconductor structure 605 may be one example of first semiconductor structure 102 in FIGS. 1-4. By moving all the peripheral circuits (e.g., row decoders 514, column decoders 516) away from semiconductor structure 605 (e.g., to semiconductor structure 601), the size of DRAM 512 (e.g., the number of DRAM cells) in semiconductor structure 605 can be increased.

Figure 7A:
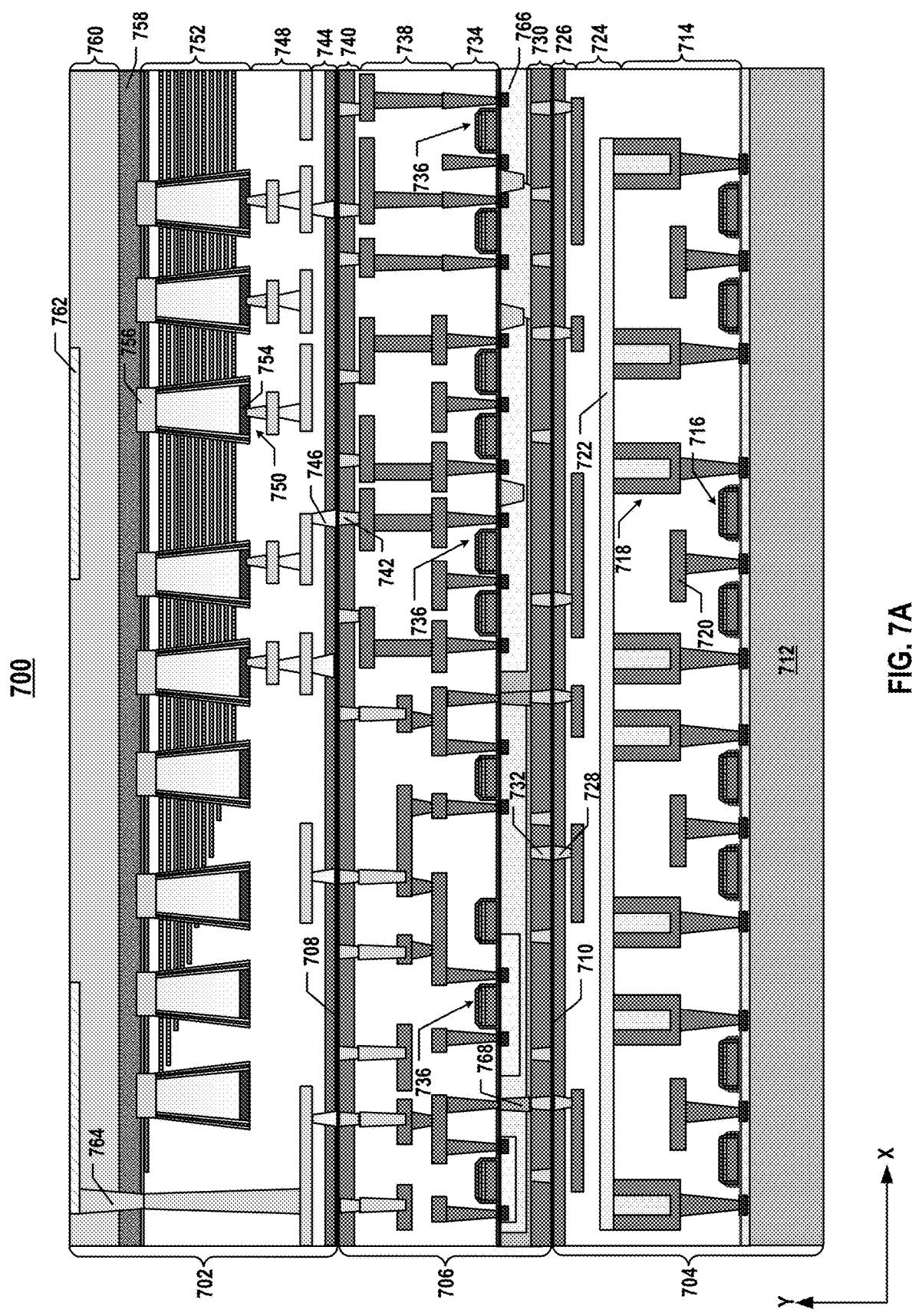
FIG. 7A illustrates a cross-section of an exemplary 3D memory device having heterogeneous memories, according to some embodiments.

FIG. 7A illustrates a cross-section of an exemplary 3D memory device 700 having heterogeneous memories, according to some embodiments. As one example of 3D memory device 100 described above with respect to FIG. 1, 3D memory device 700 is a bonded chip including a first semiconductor structure 702, a second semiconductor structure 704 below first semiconductor structure 702, and a third semiconductor structure 706 vertically between first and second semiconductor structures 702 and 704. First and third semiconductor structures 702 and 706 are joined at a first bonding interface 708 therebetween, according to some embodiments. Second and third semiconductor structures 704 and 706 are joined at a second bonding interface 710 therebetween, according to some embodiments. First bonding interface 708 is above second bonding interface 710, i.e., in different planes, according to some embodiments. As shown in FIG. 7A, second semiconductor structure 704 can include a substrate 712, which can include silicon (e.g., single crystalline silicon (c-Si)), silicon germanium (SiGe), gallium arsenide (GaAs), germanium (Ge), silicon on insulator (SOI), or any other suitable materials.

Second semiconductor structure 704 of 3D memory device 700 can include an array of DRAM cells 714 above substrate 712. It is noted that x- and y-axes are added in FIG. 7A to further illustrate the spatial relationship of the components in 3D memory device 700. Substrate 712 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device (e.g., 3D memory device 700) is determined relative to the substrate of the semiconductor device (e.g., substrate 712) in the y-direction (the vertical direction or thickness direction) when the substrate is positioned in the lowest plane of the semiconductor device in the y-direction. The same notion for describing the spatial relationship is applied throughout the present disclosure.

In some embodiments, each DRAM cell 714 includes a DRAM selection transistor 716 and a capacitor 718. DRAM cell 714 can be a 1T1C cell consisting of one transistor and one capacitor. It is understood that DRAM cell 714 may be of any suitable configuration, such as 2T1C cell, 3T1C cell, etc. In some embodiments, DRAM selection transistors 716 are formed "on" substrate 712, in which the entirety or part of DRAM selection transistors 716 are formed in substrate 712 and/or directly on substrate 712. Isolation regions (e.g., shallow trench isolations (STIs)) and doped regions (e.g., the source regions and drain of DRAM selection transistors 716) can be formed in substrate 712 as well. In some embodiments, capacitors 718 are disposed above DRAM selection transistors 716. Each capacitor 718 includes two electrodes, one of which is electrically connected to one node of respective DRAM selection transistor 716, according to some embodiments. Another node of each DRAM selection transistor 716 is electrically connected to a bit line 720 of DRAM, according to some embodiments. Another electrode of each capacitor 718 can be electrically connected to a common plate 722, e.g., a common ground. It is understood that the structure and configuration of DRAM cell 714 are not limited to the example in FIG. 7A and may include any suitable structure and configuration.

In some embodiments, second semiconductor structure 704 of 3D memory device 700 further includes an interconnect layer 724 above array of DRAM cells 714 to transfer electrical signals to and from array of DRAM cells 714. Interconnect layer 724 can include a plurality of interconnects (also referred to herein as "contacts"), including lateral interconnect lines and vertical interconnect access (via) contacts. As used herein, the term "interconnects" can broadly include any suitable types of interconnects, such as middle-end-of-line (MEOL) interconnects and back-end-of-line (BEOL) interconnects. Interconnect layer 724 can further include one or more interlayer dielectric (ILD) layers (also known as "intermetal dielectric (IMD) layers") in which the interconnect lines and via contacts can form. That is, interconnect layer 724 can include interconnect lines and via contacts in multiple ILD layers. The interconnect lines and via contacts in interconnect layer 724 can include conductive materials including, but not limited to, tungsten (W), cobalt (Co), copper (Cu), aluminum (Al), silicides, or any combination thereof. The ILD layers in interconnect layer 724 can include dielectric materials including, but not limited to, silicon oxide, silicon nitride, silicon oxynitride, low dielectric constant (low-k) dielectrics, or any combination thereof.

As shown in FIG. 7A, second semiconductor structure 704 of 3D memory device 700 can further include a bonding layer 726 at second bonding interface 710 and above interconnect layer 724 and array of DRAM cells 714. Bonding layer 726 can include a plurality of bonding contacts 728 and dielectrics electrically isolating bonding contacts 728. Bonding contacts 728 can include conductive materials including, but not limited to, W, Co, Cu, Al, silicides, or any combination thereof. The remaining area of bonding layer 726 can be formed with dielectrics including, but not limited to, silicon oxide, silicon nitride, silicon oxynitride, low-k dielectrics, or any combination thereof. Bonding contacts 728 and surrounding dielectrics in bonding layer 726 can be used for hybrid bonding.

Similarly, as shown in FIG. 7A, third semiconductor structure 706 of 3D memory device 700 can also include a bonding layer 730 at second bonding interface 710 and above bonding layer 726 of second semiconductor structure 704. Bonding layer 730 can include a plurality of bonding contacts 732 and dielectrics electrically isolating bonding contacts 732. Bonding contacts 732 can include conductive materials including, but not limited to, W, Co, Cu, Al, silicides, or any combination thereof. The remaining area of bonding layer 730 can be formed with dielectrics including, but not limited to, silicon oxide, silicon nitride, silicon oxynitride, low-k dielectrics, or any combination thereof. Bonding contacts 732 and surrounding dielectrics in bonding layer 730 can be used for hybrid bonding. Bonding contacts 732 are in contact with bonding contacts 728 at second bonding interface 710, according to some embodiments.

As described below in detail, third semiconductor structure 706 can be bonded on top of second semiconductor structure 704 in a face-to-face manner at second bonding interface 710. In some embodiments, second bonding interface 710 is disposed between bonding layers 730 and 726 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, second bonding interface 710 is the place at which bonding layers 730 and 726 are met and bonded. In practice, second bonding interface 710 can be a layer with a certain thickness that includes part of the top surface of bonding layer 726 of second semiconductor structure 704 and the bottom surface of bonding layer 730 of third semiconductor structure 706.

As shown in FIG. 7A, third semiconductor structure 706 can include a semiconductor layer 766 disposed above bonding layer 730. Semiconductor layer 766 can be a thinned substrate on which an array of SRAM cells 734 are formed. In some embodiments, semiconductor layer 766 includes single-crystal silicon. Semiconductor layer 766 can also include isolation regions (e.g., STIs) and doped regions (e.g., sources and drains of transistors 736 forming array of SRAM cells 734).

Third semiconductor structure 706 of 3D memory device 700 can also include array of SRAM cells 734 above and in contact with semiconductor layer 766. In some embodiments, a peripheral circuit is also formed above and in contact with semiconductor layer 766, i.e., in the same plane as array of SRAM cells 734. For example, the peripheral circuit may be part or the entirety of the peripheral circuits for controlling and sensing the NAND memory, DRAM, and/or SRAM of 3D memory device 700. In some embodiments, transistors 736 form array of SRAM cells 734 used as, for example, cache and/or data buffer of 3D memory device 700. In some embodiments, transistors 736 also form the peripheral circuit, i.e., any suitable digital, analog, and/or mixed-signal control and sensing circuits used for facilitating the operation of the NAND memory, DRAM, and/or SRAM including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors, etc.). Transistors 736 can be formed "on" semiconductor layer 766, in which the entirety or part of transistors 736 are formed in semiconductor layer 766 (e.g., below the top surface of semiconductor layer 766) and/or directly on semiconductor layer 766. Transistors 736 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some embodiments.

In some embodiments, third semiconductor structure 706 of 3D memory device 700 further includes an interconnect layer 738 above array of SRAM cells 734 to transfer electrical signals to and from array of SRAM cells 734.

Interconnect layer 738 can include a plurality of interconnects, such as MEOL interconnects and BEOL interconnects. In some embodiments, the interconnects in interconnect layer 738 also include local interconnects, such as bit line contacts and word line contacts. Interconnect layer 738 can further include one or more ILD layers in which the interconnect lines and via contacts can form. The interconnect lines and via contacts in interconnect layer 738 can include conductive materials including, but not limited to, W, Co, Cu, Al, silicides, or any combination thereof. The ILD layers in interconnect layer 738 can include dielectric materials including, but not limited to, silicon oxide, silicon nitride, silicon oxynitride, low-k dielectrics, or any combination thereof.

As shown in FIG. 7A, third semiconductor structure 706 of 3D memory device 700 can further include another bonding layer 740 at first bonding interface 708 and above interconnect layer 738 and array of SRAM cells 734. That is, third semiconductor structure 706 includes two bonding layers 730 and 740 on both sides of array of SRAM cells 734, according to some embodiments. For example, bonding layer 740 may be formed on the front side of third semiconductor structure 706, and bonding layer 730 may be formed on the backside of third semiconductor structure 706. Bonding layer 740 can include a plurality of bonding contacts 742 and dielectrics electrically isolating bonding contacts 742. Bonding contacts 742 can include conductive materials including, but not limited to, W, Co, Cu, Al, silicides, or any combination thereof. The remaining area of bonding layer 740 can be formed with dielectrics including, but not limited to, silicon oxide, silicon nitride, silicon oxynitride, low-k dielectrics, or any combination thereof. Bonding contacts 742 and surrounding dielectrics in bonding layer 740 can be used for hybrid bonding.

Similarly, as shown in FIG. 7A, first semiconductor structure 702 of 3D memory device 700 can also include a bonding layer 744 at first bonding interface 708 and above bonding layer 740 of third semiconductor structure 706. Bonding layer 744 can include a plurality of bonding contacts 746 and dielectrics electrically isolating bonding contacts 746. Bonding contacts 746 can include conductive materials including, but not limited to, W, Co, Cu, Al, silicides, or any combination thereof. The remaining area of bonding layer 744 can be formed with dielectrics including, but not limited to, silicon oxide, silicon nitride, silicon oxynitride, low-k dielectrics, or any combination thereof. Bonding contacts 746 and surrounding dielectrics in bonding layer 744 can be used for hybrid bonding. Bonding contacts 746 are in contact with bonding contacts 742 at first bonding interface 710708 according to some embodiments.

As described below in detail, first semiconductor structure 702 can be bonded on top of third semiconductor structure 706 in a face-to-face manner at first bonding interface 708. In some embodiments, first bonding interface 708 is disposed between bonding layers 744 and 740 as a result of hybrid bonding. In some embodiments, first bonding interface 708 is the place at which bonding layers 744 and 740 are met and bonded. In practice, first bonding interface 708 can be a layer with a certain thickness that includes part of the top surface of bonding layer 740 of third semiconductor structure 706 and the bottom surface of bonding layer 744 of first semiconductor structure 702.

In some embodiments, first semiconductor structure 702 of 3D memory device 700 further includes an interconnect layer 748 above bonding layer 744 to transfer electrical signals. Interconnect layer 748 can include a plurality of interconnects, such as MEOL interconnects and BEOL interconnects. In some embodiments, interconnects in interconnect layer 748 also include local interconnects, such as bit line contacts and word line contacts. Interconnect layer 748 can further include one or more ILD layers in which the interconnect lines and via contacts can form. The interconnect lines and via contacts in interconnect layer 748 can include conductive materials including, but not limited to, W, Co, Cu, Al, silicides, or any combination thereof. The ILD layers in interconnect layer 748 can include dielectric materials including, but not limited to, silicon oxide, silicon nitride, silicon oxynitride, low-k dielectrics, or any combination thereof.

As shown in FIG. 7A, first semiconductor structure 702 of 3D memory device 700 includes a NAND flash memory device in which memory cells are provided in the form of an array of 3D NAND memory strings 750 above interconnect layer 748 and bonding layer 744. Each 3D NAND memory string 750 extends vertically through a plurality of pairs each including a conductor layer and a dielectric layer, according to some embodiments. The stacked and interleaved conductor layers and dielectric layer are also referred to herein as a memory stack 752. The interleaved conductor layers and dielectric layers in memory stack 752 alternate in the vertical direction, according to some embodiments. In other words, except the ones at the top or bottom of memory stack 752, each conductor layer can be adjoined by two dielectric layers on both sides, and each dielectric layer can be adjoined by two conductor layers on both sides. The conductor layers can each have the same thickness or different thicknesses. Similarly, the dielectric layers can each have the same thickness or different thicknesses. The conductor layers can include conductor materials including, but not limited to, W, Co, Cu, Al, doped silicon, silicides, or any combination thereof. The dielectric layers can include dielectric materials including, but not limited to, silicon oxide, silicon nitride, silicon oxynitride, or any combination thereof.

In some embodiments, each 3D NAND memory string 750 is a "charge trap" type of NAND memory string including a semiconductor channel and a memory film. In some embodiments, the semiconductor channel includes silicon, such as amorphous silicon, polysilicon, or single crystalline silicon. In some embodiments, the memory film is a composite dielectric layer including a tunneling layer, a storage layer (also known as "charge trap/storage layer"), and a blocking layer. Each 3D NAND memory string 750 can have a cylinder shape (e.g., a pillar shape). The semiconductor channel, tunneling layer, storage layer, and blocking layer of the memory film are arranged along a direction from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, the blocking layer can include a composite layer of silicon oxide/silicon oxynitride/silicon oxide (ONO). In another example, the blocking layer can include a high-k dielectric layer, such as aluminum oxide ($Al_2O_3$), hafnium oxide (HfO2) or tantalum oxide ($Ta_2O_5$) layer, and so on.

In some embodiments, 3D NAND memory strings 750 further include a plurality of control gates (each being part of a word line). Each conductor layer in memory stack 752 can act as a control gate for each memory cell of 3D NAND memory string 750. In some embodiments, each 3D NAND memory string 750 includes two plugs 756 and 754 at a respective end in the vertical direction. Plug 756 can include a semiconductor material, such as single-crystal silicon, that is epitaxially grown from a semiconductor layer 758. Plug 756 can function as the controller of source select gate of 3D NAND memory string 750. Plug 756 can be at the upper end of 3D NAND memory string 750 and in contact with semiconductor layer 758. As used herein, the "upper end" of a component (e.g., 3D NAND memory string 750) is the end farther away from substrate 712 in the y-direction, and the "lower end" of the component (e.g., 3D NAND memory string 750) is the end closer to substrate 712 in the y-direction when substrate 712 is positioned in the lowest plane of 3D memory device 700. Another plug 754 can include semiconductor materials (e.g., polysilicon). In some embodiments, plug 754 functions as the drain of 3D NAND memory string 750.

In some embodiments, first semiconductor structure 702 further includes semiconductor layer 758 disposed above memory stack 752 and 3D NAND memory strings 750. Semiconductor layer 758 can be a thinned substrate on which memory stack 752 and 3D NAND memory strings 750 are formed. In some embodiments, semiconductor layer 758 includes single-crystal silicon from which plugs 756 can be epitaxially grown. In some embodiments, semiconductor layer 758 can include polysilicon, amorphous silicon, SiGe, GaAs, Ge, or any other suitable materials. Semiconductor layer 758 can also include isolation regions (e.g., STIs) and doped regions (e.g., functioning as an array common source (ACS) for 3D NAND memory strings 750, not shown). Isolation regions (not shown) can extend across the entire thickness or part of the thickness of semiconductor layer 758 to electrically isolate the doped regions. In some embodiments, a pad oxide layer including silicon oxide is disposed between memory stack 752 and semiconductor layer 758.

It is understood that 3D NAND memory strings 750 are not limited to the "charge trap" type of 3D NAND memory strings and may be "floating gate" type of 3D NAND memory strings in other embodiments. It is also understood that memory stack 752 is not limited to having the single-deck structure but also can have a multiple-deck structure with inter-deck plugs among different decks for electrical connections of 3D NAND memory strings 750. Semiconductor layer 758 may include polysilicon as the source plate of the "floating gate" type of 3D NAND memory strings.

As shown in FIG. 7A, first semiconductor structure 702 of 3D memory device 700 can further include a pad-out interconnect layer 760 above semiconductor layer 758. Pad-out interconnect layer 760 can include interconnects, e.g., contact pads 762, in one or more ILD layers. Pad-out interconnect layer 760 and interconnect layer 748 can be formed on both sides of semiconductor layer 758. In some embodiments, interconnects in pad-out interconnect layer 760 can transfer electrical signals between 3D memory device 700 and outside circuits, e.g., for pad-out purposes.

In some embodiments, first semiconductor structure 702 further includes one or more contacts 764 extending through semiconductor layer 758 to electrically connect pad-out interconnect layer 760 and interconnect layer 748. Similarly, in some embodiments, third semiconductor structure 706 further includes one or more contacts 768 extending through semiconductor layer 766 to electrically connect interconnect layer 738 in third semiconductor structure 706 and interconnect layer 724 in second semiconductor structure 704. As a result, array of SRAM cells 734 (and the peripheral circuit if any) can be electrically connected to array of 3D NAND memory strings 750 through interconnect layers 738 and 748 as well as bonding contacts 742 and 746. Array of SRAM cells 734 (and the peripheral circuit if any) can be electrically connected to array of DRAM cells 714 through contacts 768, interconnect layer 724, as well as bonding contacts 732 and 728. Array of 3D NAND memory strings 750 can be electrically connected to array of DRAM cells 714 through contacts 768, interconnect layers 748, 738, and 724, as well as bonding contacts 746, 742, 732, and 728. Moreover, array of SRAM cells 734, array of 3D NAND memory strings 750, and array of DRAM cells 714 can be electrically connected to outside circuits through contacts 764 and pad-out interconnect layer 760.

Figure 7B:
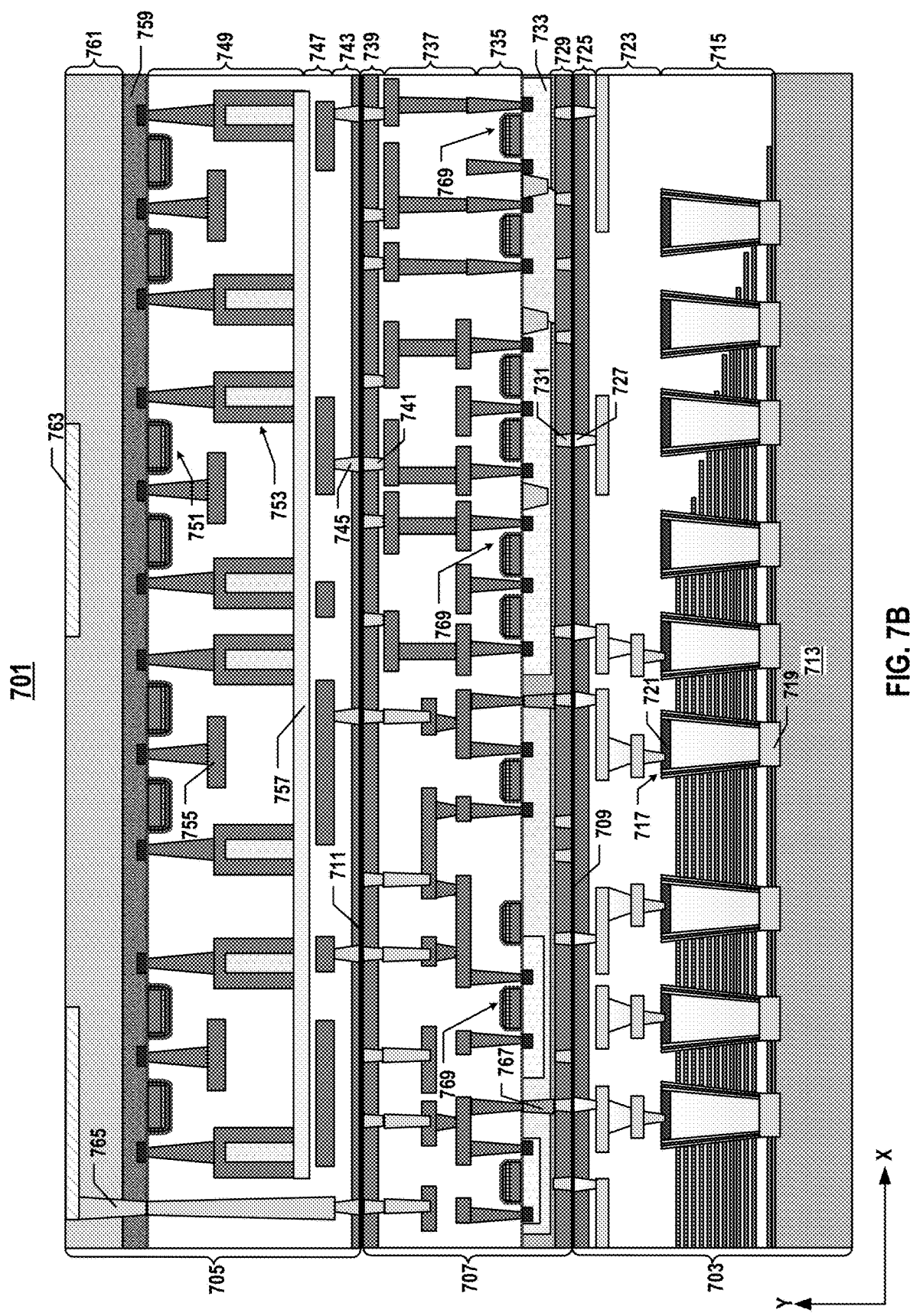
FIG. 7B illustrates a cross-section of another exemplary 3D memory device having heterogeneous memories, according to some embodiments.

FIG. 7B illustrates a cross-section of another exemplary 3D memory device 701 having heterogeneous memories, according to some embodiments. As one example of 3D memory device 200 described above with respect to FIG. 2, 3D memory device 701 is a bonded chip including a second semiconductor structure 705 including DRAM above a third semiconductor structure 707 including SRAM, which is above a first semiconductor structure 703 including NAND memory. Similar to 3D memory device 700 described above in FIG. 7A, 3D memory device 701 represents an example of a bonded chip in which third semiconductor structure 707 including SRAM, first semiconductor structure 703 including NAND memory, and second semiconductor structure 705 including DRAM are formed separately and bonded in a face-to-face manner at a first bonding interface 709 and a second bonding interface 711, respectively, in different planes. Similar to 3D memory device 700 described above in FIG. 7A, third semiconductor structure 707 including SRAM is in the middle of three semiconductor structures 703, 705, and 707, i.e., sandwiched between first semiconductor structure 703 including NAND memory and second semiconductor structure 705 including DRAM. Different from 3D memory device 700 described above in FIG. 7A in which second semiconductor structure 704 including DRAM is below first semiconductor structure 702 including NAND memory, 3D memory device 701 in FIG. 7B includes third semiconductor structure 705 including DRAM disposed above first semiconductor structure 703 including NAND memory. It is understood that the details of similar structures (e.g., materials, fabrication process, functions, etc.) in both 3D memory devices 700 and 701 may not be repeated below.

First semiconductor structure 703 of 3D memory device 701 can include a substrate 713 and a memory stack 715 including interleaved conductor layers and dielectric layers above substrate 713. In some embodiments, an array of 3D NAND memory strings 717 each extends vertically through the interleaved conductor layers and dielectric layers in memory stack 715 above substrate 713. Each 3D NAND memory string 717 can include a semiconductor channel and a memory film. Each 3D NAND memory string 717 further includes two plugs 719 and 721 at its lower end and upper end, respectively. 3D NAND memory strings 717 can be "charge trap" type of 3D NAND memory strings or "floating gate" type of 3D NAND memory strings. In some embodiments, a pad oxide layer including silicon oxide is disposed between memory stack 715 and substrate 713.

In some embodiments, first semiconductor structure 703 of 3D memory device 701 also includes an interconnect layer 723 above memory stack 715 and 3D NAND memory strings 717 to transfer electrical signals to and from 3D NAND memory strings 717. Interconnect layer 723 can include a plurality of interconnects, including interconnect lines and via contacts. In some embodiments, interconnects in interconnect layer 723 also include local interconnects, such as bit line contacts and word line contacts. In some embodiments, first semiconductor structure 703 of 3D memory device 701 further includes a bonding layer 725 at first bonding interface 709 and above interconnect layer 723 and memory stack 715 (including 3D NAND memory strings 717 therethrough). Bonding layer 725 can include a plurality of bonding contacts 727 and dielectrics surrounding and electrically isolating bonding contacts 727.

Similarly, as shown in FIG. 7B, third semiconductor structure 707 of 3D memory device 701 can also include a bonding layer 729 at first bonding interface 709 and above bonding layer 725 of first semiconductor structure 703. Bonding layer 729 can include a plurality of bonding contacts 731 and dielectrics surrounding and electrically isolating bonding contacts 731. Bonding contacts 731 are in contact with bonding contacts 727 at first bonding interface 709, according to some embodiments. Third semiconductor structure 707 can be bonded on top of first semiconductor structure 704 in a face-to-face manner at first bonding interface 709. In some embodiments, first bonding interface 709 is disposed between bonding layers 729 and 725 as a result of hybrid bonding. In some embodiments, first bonding interface 709 is the place at which bonding layers 729 and 725 are met and bonded. In practice, first bonding interface 709 can be a layer with a certain thickness that includes part of the top surface of bonding layer 725 of first semiconductor structure 703 and the bottom surface of bonding layer 729 of third semiconductor structure 707.

As shown in FIG. 7B, third semiconductor structure 707 can include a semiconductor layer 733 disposed above bonding layer 729. Semiconductor layer 733 can be a thinned substrate on which an array of SRAM cells 735 are formed. In some embodiments, semiconductor layer 733 includes single-crystal silicon. Semiconductor layer 733 can also include isolation regions (e.g., STIs) and doped regions (e.g., sources and drains of transistors 769 forming array of SRAM cells 735).

Third semiconductor structure 707 of 3D memory device 701 can also include array of SRAM cells 735 above and in contact with semiconductor layer 733. In some embodiments, a peripheral circuit is also formed above and in contact with semiconductor layer 733, i.e., in the same plane as array of SRAM cells 735. In some embodiments, transistors 769 form array of SRAM cells 735 used as, for example, cache and/or data buffer of 3D memory device 701. In some embodiments, transistors 769 also form the peripheral circuit, i.e., any suitable digital, analog, and/or mixed-signal control and sensing circuits used for facilitating the operation of the NAND memory, DRAM, and/or SRAM. Transistors 769 can be formed "on" semiconductor layer 733, in which the entirety or part of transistors 769 are formed in semiconductor layer 733 (e.g., below the top surface of semiconductor layer 733) and/or directly on semiconductor layer 733. Transistors 769 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some embodiments.

In some embodiments, third semiconductor structure 707 of 3D memory device 701 further includes an interconnect layer 737 above array of SRAM cells 735 to transfer electrical signals to and from array of SRAM cells 735. Interconnect layer 737 can include a plurality of interconnects, including interconnect lines and via contacts. In some embodiments, interconnects in interconnect layer 737 also include local interconnects, such as bit line contacts and word line contacts. In some embodiments, third semiconductor structure 707 of 3D memory device 701 further includes a bonding layer 739 at second bonding interface 711 and above interconnect layer 737 and array of SRAM cells 735. That is, third semiconductor structure 707 includes two bonding layers 729 and 739 on both sides of array of SRAM cells 735, according to some embodiments. For example, bonding layer 739 may be formed on the front side of third semiconductor structure 707, and bonding layer 729 may be formed on the backside of third semiconductor structure 707. Bonding layer 739 can include a plurality of bonding contacts 741 and dielectrics surrounding and electrically isolating bonding contacts 741.

Similarly, as shown in FIG. 7B, second semiconductor structure 705 of 3D memory device 701 can also include a bonding layer 743 at second bonding interface 711 and above bonding layer 739 of third semiconductor structure 707. Bonding layer 743 can include a plurality of bonding contacts 745 and dielectrics surrounding and electrically isolating bonding contacts 745. Bonding contacts 745 are in contact with bonding contacts 741 at second bonding interface 711, according to some embodiments. Second semiconductor structure 705 can be bonded on top of third semiconductor structure 707 in a face-to-face manner at second bonding interface 711. In some embodiments, second bonding interface 711 is disposed between bonding layers 743 and 739 as a result of hybrid bonding. In some embodiments, second bonding interface 711 is the place at which bonding layers 743 and 739 are met and bonded. In practice, second bonding interface 711 can be a layer with a certain thickness that includes part of the top surface of bonding layer 739 of third semiconductor structure 707 and the bottom surface of bonding layer 743 of second semiconductor structure 705.

In some embodiments, second semiconductor structure 705 of 3D memory device 701 also includes an interconnect layer 747 above bonding layer 743 to transfer electrical signals. Interconnect layer 747 can include a plurality of interconnects, including interconnect lines and via contacts. In some embodiments, interconnects in interconnect layer 747 also include local interconnects, such as bit line contacts and word line contacts.

As shown in FIG. 7B, second semiconductor structure 705 of 3D memory device 701 can further include an array of DRAM cells 749 above interconnect layer 747. In some embodiments, each DRAM cell 749 includes a DRAM selection transistor 751 and a capacitor 753. DRAM cell 749 can be a 1T1C cell consisting of one transistor and one capacitor. It is understood that DRAM cell 749 may be of any suitable configuration, such as 2T1C cell, 3T1C cell, etc. In some embodiments, DRAM selection transistors 751 are formed on a semiconductor layer 759, in which the entirety or part of DRAM selection transistors 751 are formed in semiconductor layer 759 and/or directly on semiconductor layer 759. In some embodiments, capacitors 753 are disposed below DRAM selection transistors 751. Each capacitor 753 includes two electrodes, one of which is electrically connected to one node of respective DRAM selection transistor 751, according to some embodiments. Another node of each DRAM selection transistor 751 is electrically connected to a bit line 755 of DRAM, according to some embodiments. Another electrode of each capacitor 753 can be electrically connected to a common plate 757, e.g., a common ground. It is understood that the structure and configuration of DRAM cell 749 are not limited to the example in FIG. 7B and may include any suitable structure and configuration.

In some embodiments, second semiconductor structure 705 further includes semiconductor layer 759 disposed above array of DRAM cells 749. Semiconductor layer 759 can be a thinned substrate on which array of DRAM cells 749 are formed. In some embodiments, semiconductor layer 759 includes single-crystal silicon. Semiconductor layer 759 can also include isolation regions (e.g., STIs) and doped regions (e.g., the sources and drains of DRAM selection transistors 751, not shown).

As shown in FIG. 7B, second semiconductor structure 705 of 3D memory device 701 can further include a pad-out interconnect layer 761 above semiconductor layer 759. Pad-out interconnect layer 761 can include interconnects, e.g., contact pads 763, in one or more ILD layers. Pad-out interconnect layer 761 and interconnect layer 747 can be formed on both sides of semiconductor layer 759. In some embodiments, interconnects in pad-out interconnect layer 761 can transfer electrical signals between 3D memory device 701 and outside circuits, e.g., for pad-out purposes. In some embodiments, second semiconductor structure 705 further includes one or more contacts 765 extending through semiconductor layer 759 to electrically connect pad-out interconnect layer 761 and interconnect layer 747. Similarly, in some embodiments, third semiconductor structure 707 further includes one or more contacts 767 extending through semiconductor layer 733 to electrically connect interconnect layer 737 in third semiconductor structure 707 and interconnect layer 723 in first semiconductor structure 703.

As a result, array of SRAM cells 735 (and the peripheral circuit if any) can be electrically connected to array of 3D NAND memory strings 717 through contacts 767, interconnect layer 723, as well as bonding contacts 731 and 727. Array of SRAM cells 735 (and the peripheral circuit if any) can be electrically connected to array of DRAM cells 749 through interconnect layers 747 and 737 as well as bonding contacts 745 and 741. Array of NAND memory strings 717 can be electrically connected to array of DRAM cells 749 through contacts 767, interconnect layers 723, 737, and 747, as well as bonding contacts 745, 741, 731, and 727. Moreover, array of SRAM cells 735, array of 3D NAND memory strings 717, and array of DRAM cells 749 can be electrically connected to outside circuits through contacts 765 and pad-out interconnect layer 761.

It is understood that although 3D memory devices 700 and 701 in FIGS. 7A and 7B illustrate examples of 3D memory devices 100 and 200 in FIGS. 1 and 2, respectively, 3D memory devices 300 and 400 in FIGS. 3 and 4 may be implemented in the same vein as described above with respect to FIGS. 7A and 7B, which are not repeated herein.

Figure 8A:
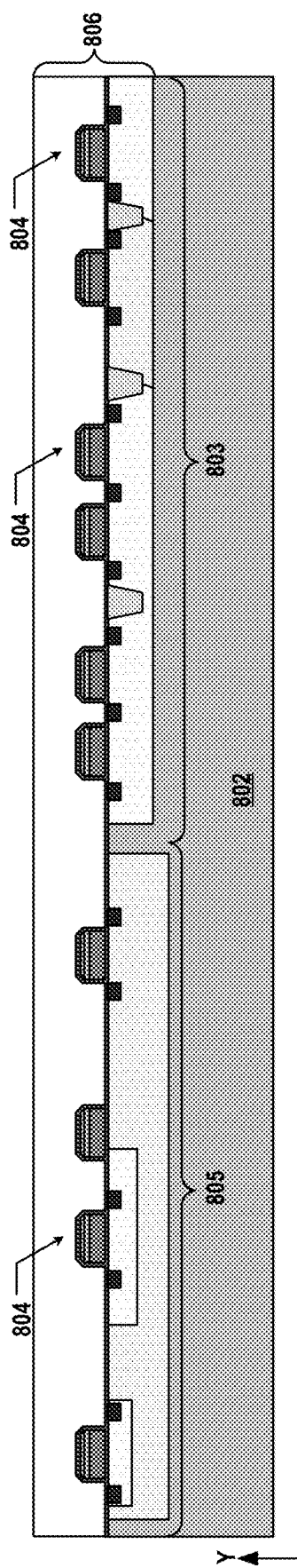
FIGS. 8A and 8B illustrate a fabrication process for forming an exemplary semiconductor structure having SRAM and peripheral circuits, according to some embodiments.
Figure 8B:
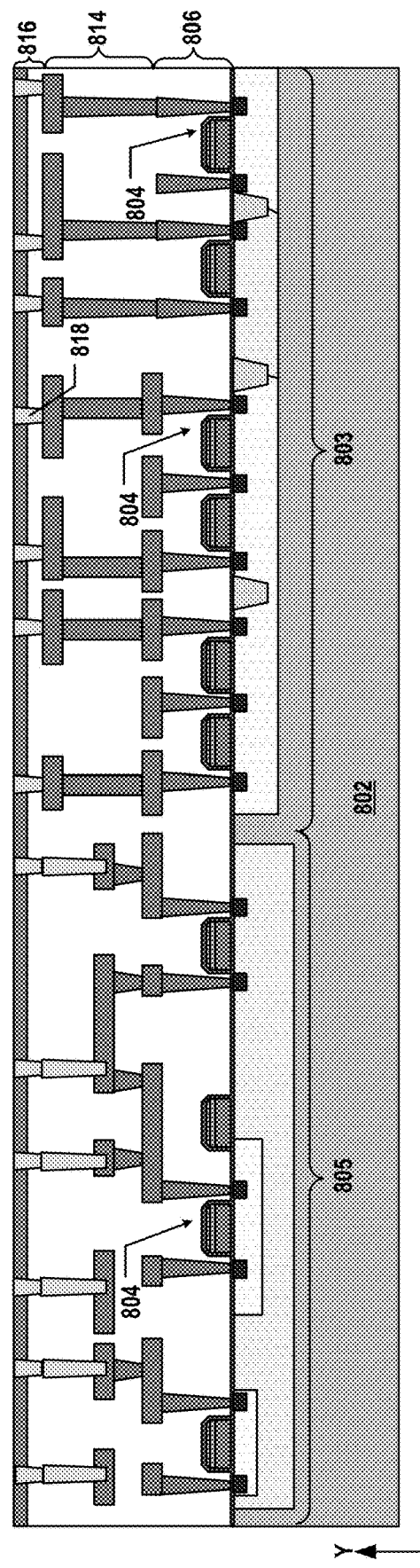
Figure 9A:
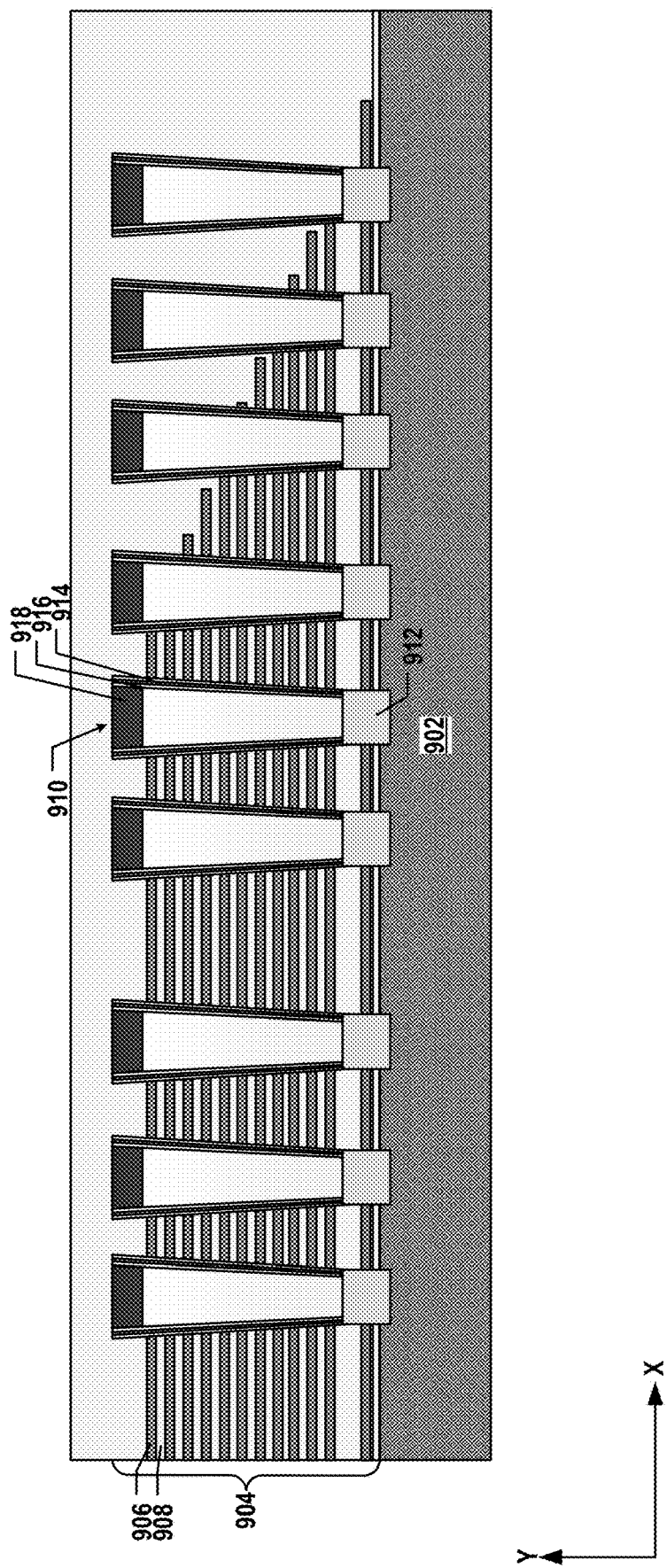
FIGS. 9A and 9B illustrate a fabrication process for forming an exemplary semiconductor structure having 3D NAND memory strings, according to some embodiments.
Figure 9B:
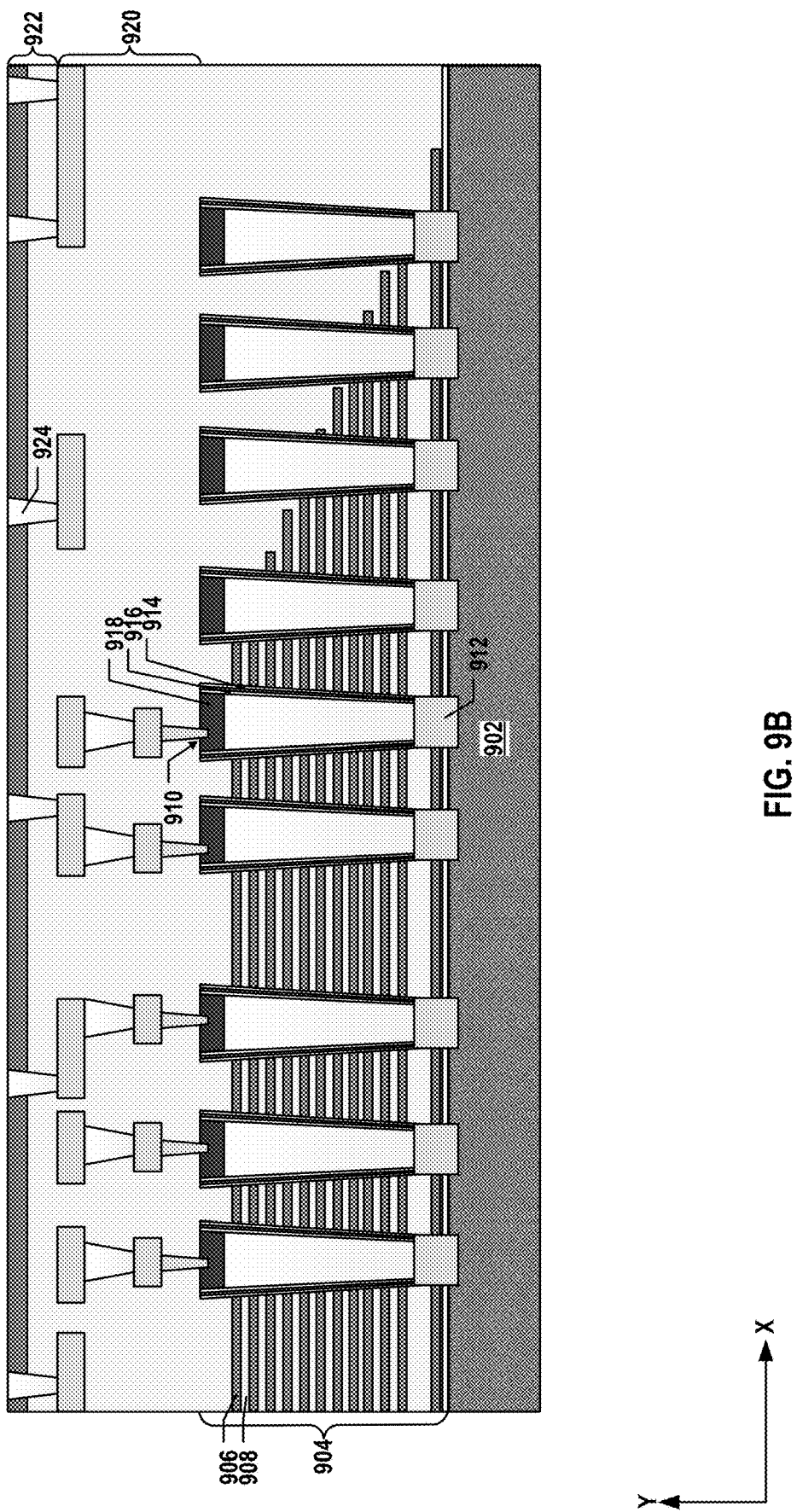
Figure 10C:
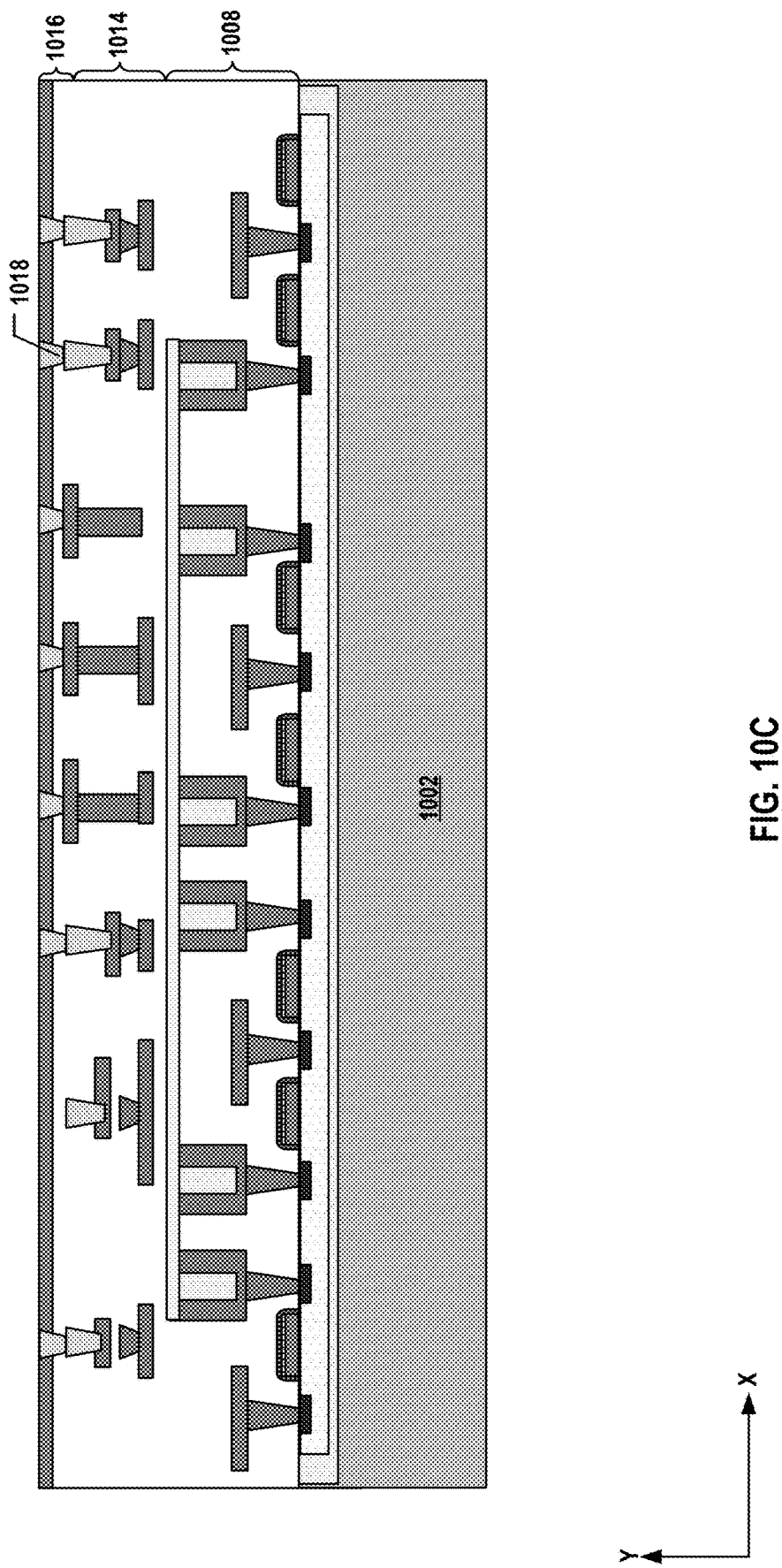
Figure 11A:
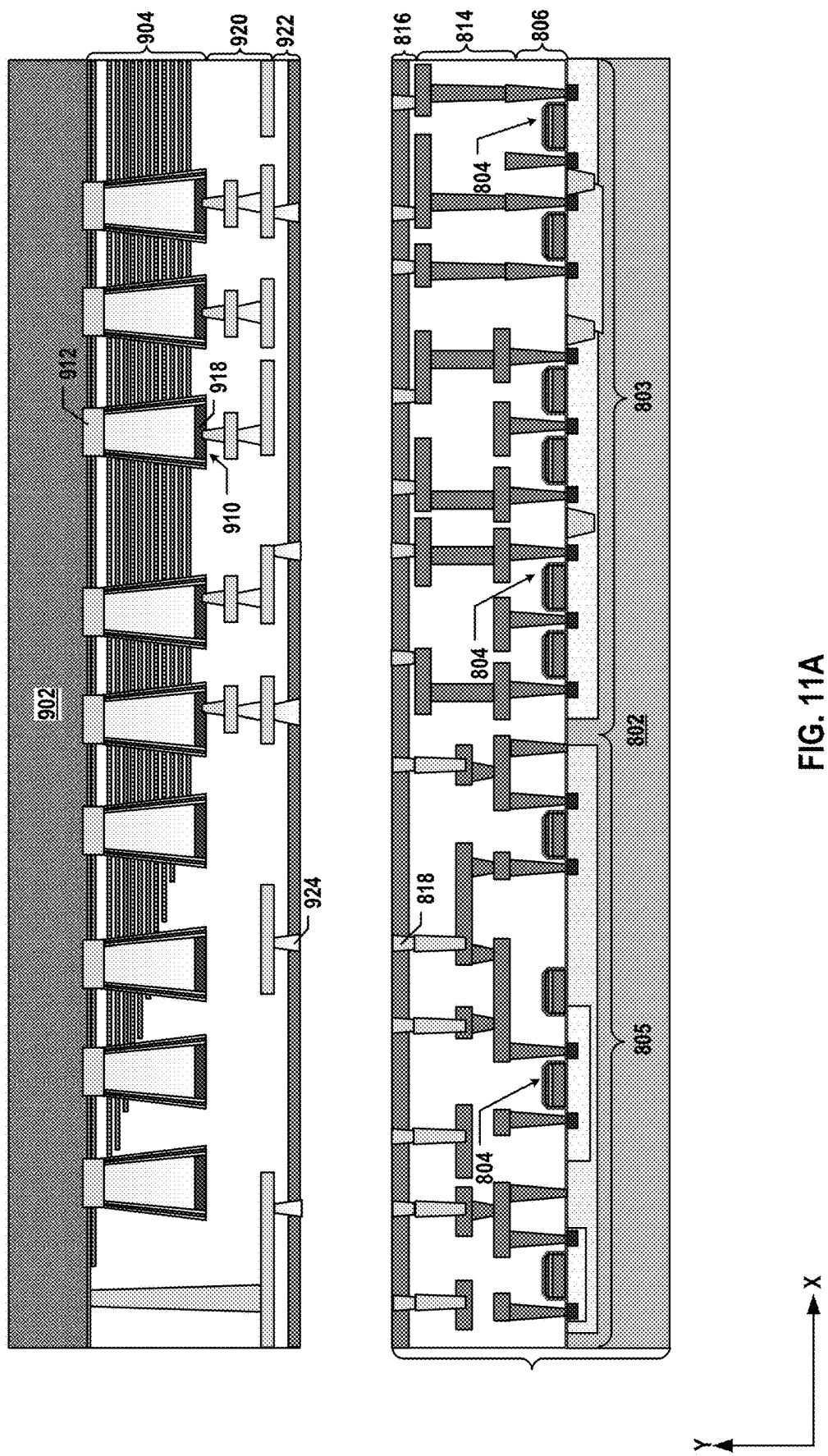
FIGS. 11A and 11B illustrate a fabrication process for forming an exemplary bonded structure, according to some embodiments.
Figure 11B:
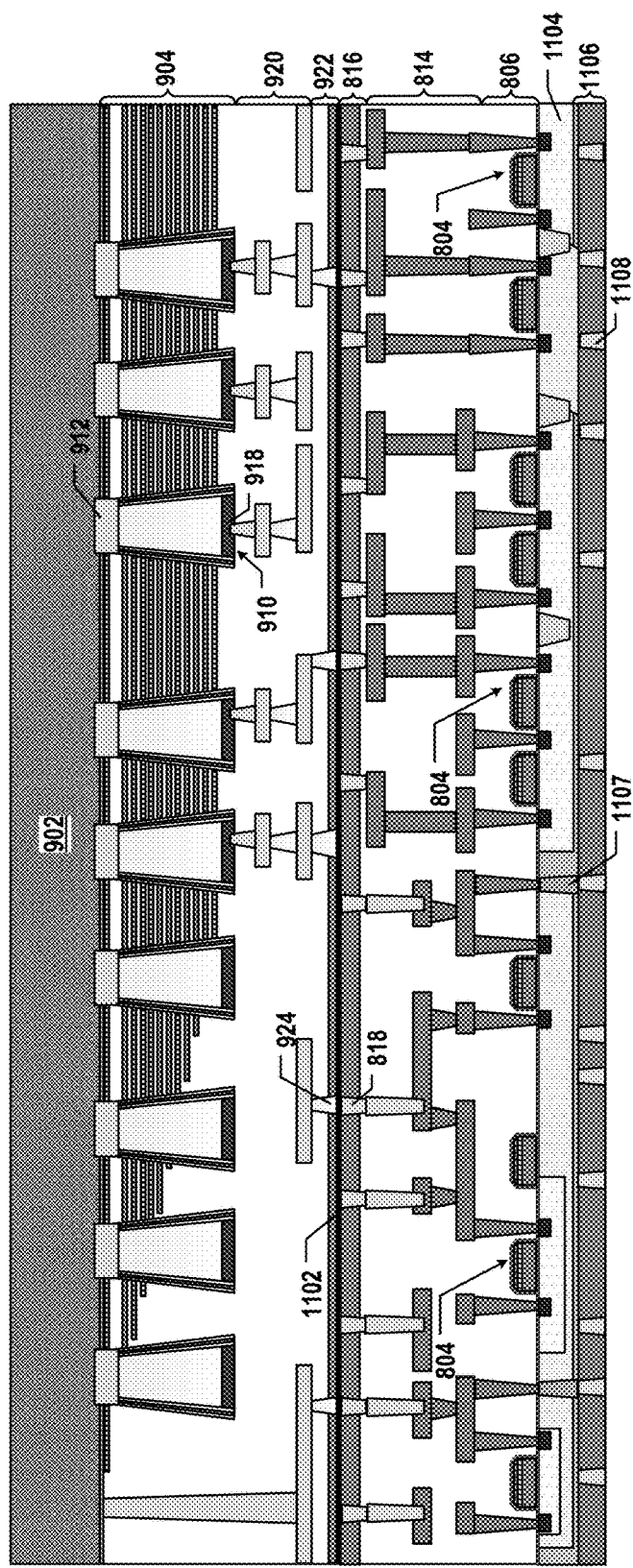
Figure 12A:
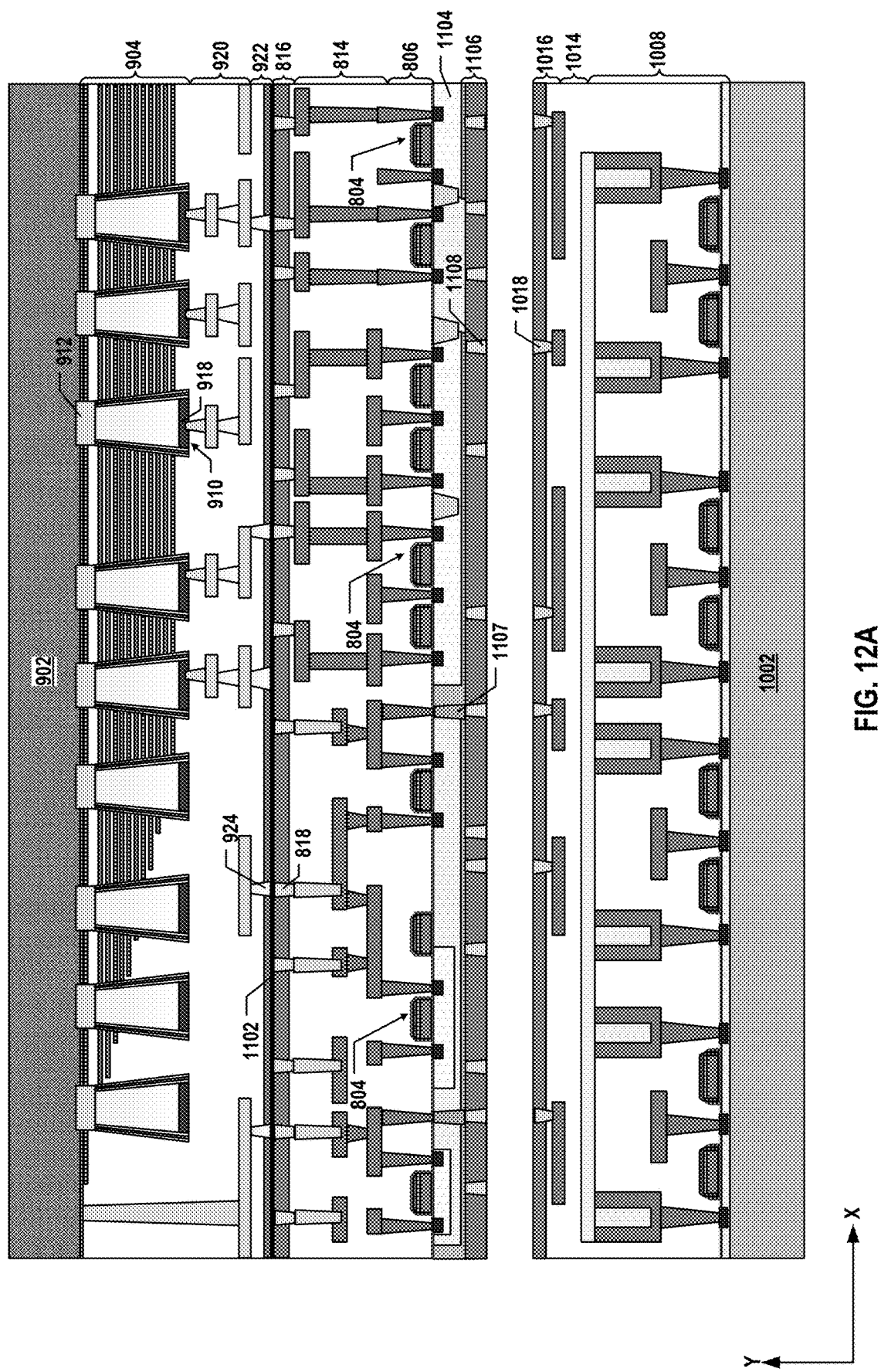
FIGS. 12A and 12B illustrate a fabrication process for an exemplary 3D memory device having heterogeneous memories, according to some embodiments.
Figure 12B:
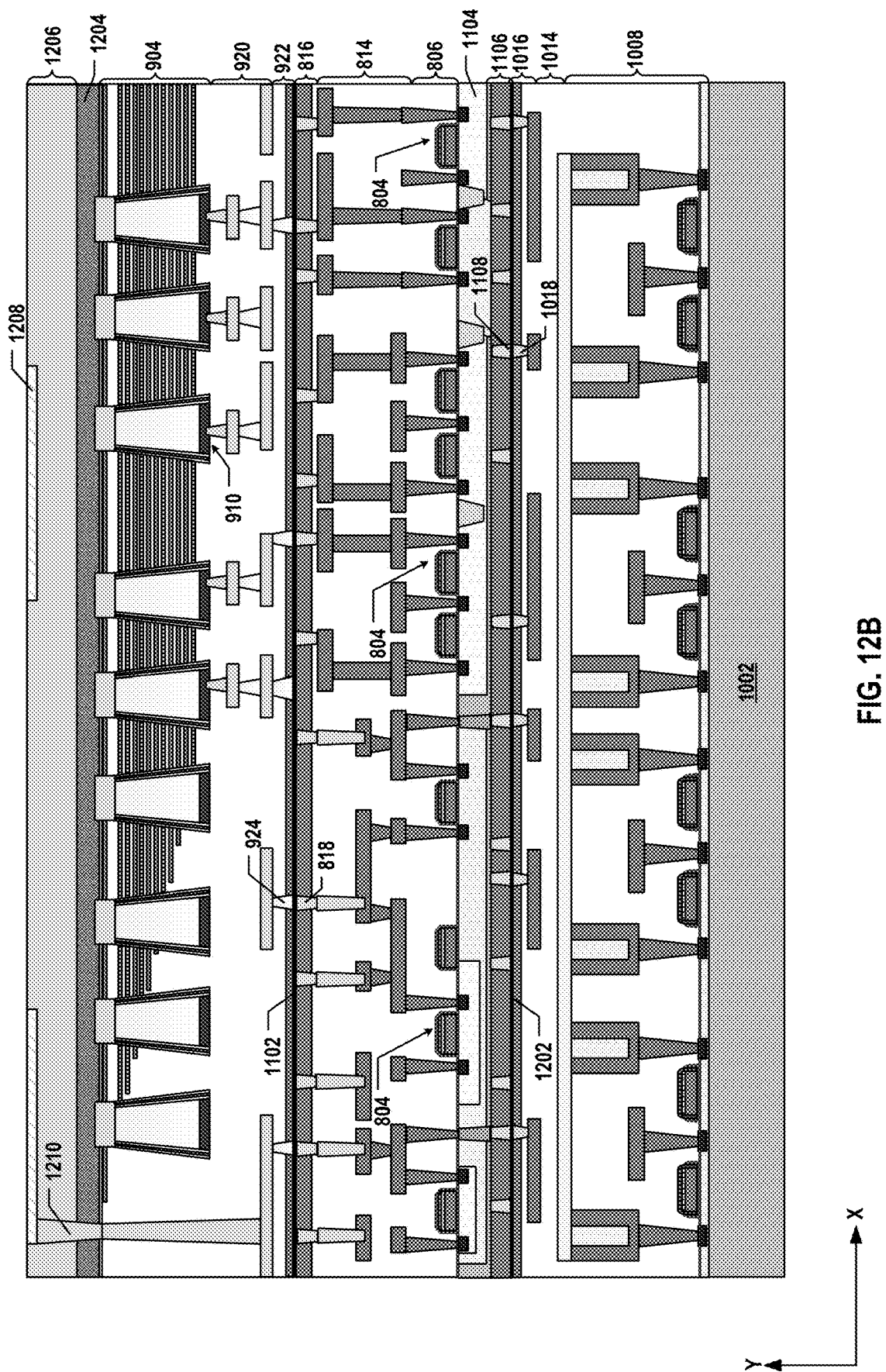
Figure 16A:
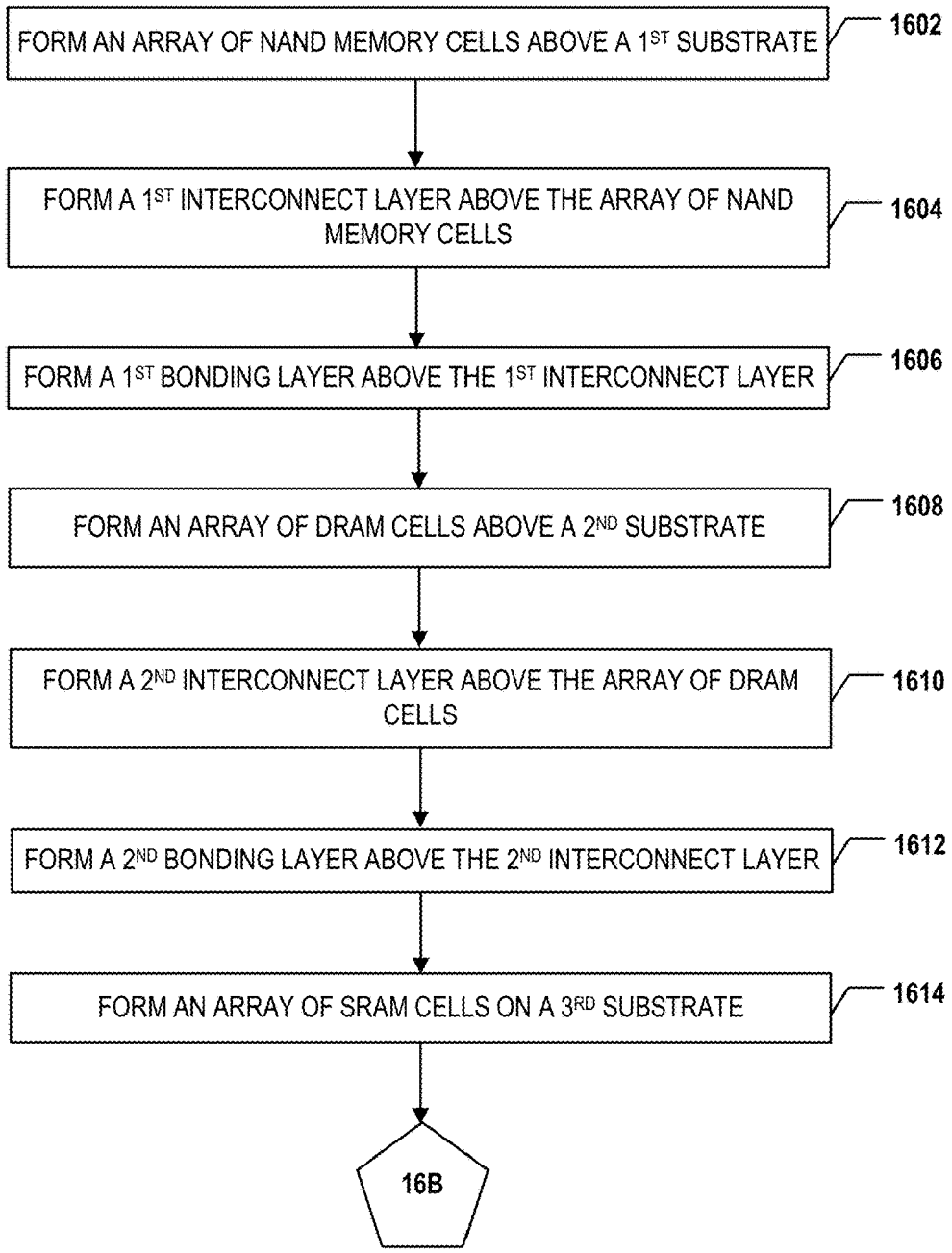
FIGS. 16A and 16B illustrate a flowchart of an exemplary method for forming a 3D memory device having heterogeneous memories, according to some embodiments.
Figure 16B:
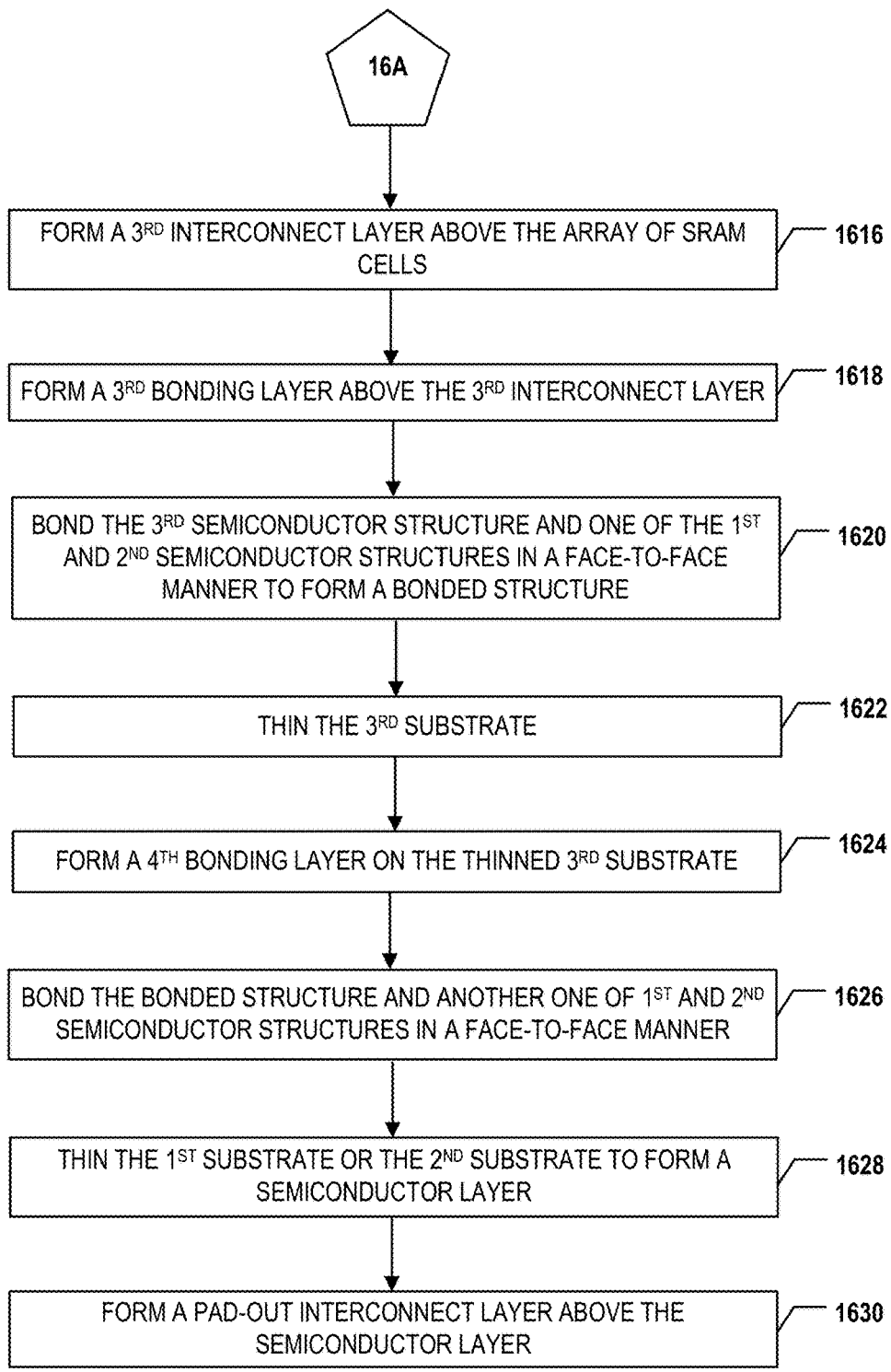

FIGS. 8A and 8B illustrate a fabrication process for forming an exemplary semiconductor structure having SRAM and peripheral circuits, according to some embodiments. FIGS. 9A and 9B illustrate a fabrication process for forming an exemplary semiconductor structure having 3D NAND memory strings, according to some embodiments. FIGS. 10A-10C illustrate a fabrication process for forming an exemplary semiconductor structure having DRAM cells, according to some embodiments. FIGS. 11A and 11B illustrate a fabrication process for forming an exemplary bonded structure, according to some embodiments. FIGS. 12A and 12B illustrate a fabrication process for an exemplary 3D memory device having heterogeneous memories, according to some embodiments. FIGS. 16A and 16B illustrate a flowchart of an exemplary method 1600 for forming a 3D memory device having heterogeneous memories, according to some embodiments. Examples of the semiconductor devices depicted in FIGS. 8A, 8B, 9A, 9B, 10A-10C, 11A, 11B, 12A, 12B, 16A, and 16B include 3D memory devices 700 and 701 depicted in FIGS. 7A and 7B. It is understood that the operations shown in method 1600 are not exhaustive and that other operations can be performed as well before, after, or between any of the illustrated operations. Further, some of the operations may be performed simultaneously, or in a different order than shown in FIGS. 16A and 16B.

As depicted in FIGS. 9A and 9B, a first semiconductor structure including an array of 3D NAND memory strings and a first bonding layer including a plurality of first bonding contacts is formed. As depicted in FIGS. 10A-10C, a second semiconductor structure including an array of DRAM cells and a second bonding layer including a plurality of second bonding contacts is formed. As depicted in FIGS. 8A and 8B, a third semiconductor structure including an array of SRAM cells, a peripheral circuit, and a third bonding layer including a plurality of third bonding contacts is formed. As depicted in FIGS. 11A and 11B, the third semiconductor structure and one of the first and second semiconductor structures are bonded in a face-to-face manner to form a bonded structure having a first bonding interface between the third bonding layer and one of the first and second bonding layers. As depicted in FIGS. 12A and 12B, the bonded structure and another one of the first and second semiconductor structures are bonded in a face-to-face manner to form a second bonding interface between the fourth bonding layer and another one of the first and second bonding layers.

Referring to FIG. 16A, method 1600 starts at operation 1602, in which an array of NAND memory cells is formed above a first substrate. The first substrate can be a silicon substrate. The array of NAND memory cells can be an array of 3D NAND memory strings. In some embodiments, a peripheral circuit of the array of NAND memory cells is also formed on the first substrate.

As illustrated in FIG. 9A, interleaved sacrificial layers (not shown) and dielectric layers 908 are formed above a silicon substrate 902. The interleaved sacrificial layers and dielectric layers 908 can form a dielectric stack (not shown). In some embodiments, each sacrificial layer includes a layer of silicon nitride, and each dielectric layer 908 includes a layer of silicon oxide. The interleaved sacrificial layers and dielectric layers 908 can be formed by one or more thin film deposition processes including, but not limited to, chemical vapor deposition (CVD), physical vapor deposition (PVD), atomic layer deposition (ALD), or any combination thereof. In some embodiments, a memory stack 904 can be formed by a gate replacement process, e.g., replacing the sacrificial layers with conductor layers 906 using wet/dry etch of the sacrificial layers selective to dielectric layers 908 and filling the resulting recesses with conductor layers 906. As a result, memory stack 904 can include interleaved conductor layers 906 and dielectric layers 908. In some embodiments, each conductor layer 906 includes a metal layer, such as a layer of tungsten. It is understood that memory stack 904 may be formed by alternatingly depositing conductor layers (e.g., doped polysilicon layers) and dielectric layers (e.g., silicon oxide layers) without the gate replacement process in other embodiments. In some embodiments, a pad oxide layer including silicon oxide is formed between memory stack 904 and silicon substrate 902.

As illustrated in FIG. 9A, 3D NAND memory strings 910 are formed above silicon substrate 902, each of which extends vertically through interleaved conductor layers 906 and dielectric layers 908 of memory stack 904. In some embodiments, fabrication processes to form 3D NAND memory string 910 include forming a channel hole through memory stack 904 and into silicon substrate 902 using dry etching/and or wet etching, such as deep reactive-ion etching (DRIE), followed by epitaxially growing a plug 912 in the lower portion of the channel hole from silicon substrate 902. In some embodiments, fabrication processes to form 3D NAND memory string 910 also include subsequently filling the channel hole with a plurality of layers, such as a memory film 914 (e.g., a tunneling layer, a storage layer, and a blocking layer) and a semiconductor layer 916, using thin film deposition processes such as ALD, CVD, PVD, or any combination thereof. In some embodiments, fabrication processes to form 3D NAND memory string 910 further include forming another plug 918 in the upper portion of the channel hole by etching a recess at the upper end of 3D NAND memory string 910, followed by filling the recess with a semiconductor material using thin film deposition processes such as ALD, CVD, PVD, or any combination thereof.

Method 1600 proceeds to operation 1604, as illustrated in FIG. 16A, in which a first interconnect layer is formed above the array of NAND memory cells. The first interconnect layer can include a first plurality of interconnects in one or more ILD layers. As illustrated in FIG. 9B, an interconnect layer 920 can be formed above memory stack 904 and array of 3D NAND memory strings 910. Interconnect layer 920 can include interconnects of MEOL and/or BEOL in a plurality of ILD layers to make electrical connections with array of 3D NAND memory strings 910. In some embodiments, interconnect layer 920 includes multiple ILD layers and interconnects therein formed in multiple processes. For example, the interconnects in interconnect layer 920 can include conductive materials deposited by one or more thin film deposition processes including, but not limited to, CVD, PVD, ALD, electroplating, electroless plating, or any combination thereof. Fabrication processes to form interconnects can also include photolithography, chemical mechanical polishing (CMP), wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 9B can be collectively referred to as interconnect layer 920.

Method 1600 proceeds to operation 1606, as illustrated in FIG. 16A, in which a first bonding layer is formed above the first interconnect layer. The first bonding layer can include a plurality of first bonding contacts. As illustrated in FIG. 9B, a bonding layer 922 is formed above interconnect layer 920. Bonding layer 922 can include a plurality of bonding contacts 924 surrounded by dielectrics. In some embodiments, a dielectric layer is deposited on the top surface of interconnect layer 920 by one or more thin film deposition processes including, but not limited to, CVD, PVD, ALD, or any combination thereof. Bonding contacts 924 then can be formed through the dielectric layer and in contact with the interconnects in interconnect layer 920 by first patterning contact holes through the dielectric layer using a patterning process (e.g., photolithography and dry/wet etch of dielectric materials in the dielectric layer). The contact holes can be filled with a conductor (e.g., copper). In some embodiments, filling the contact holes includes depositing an adhesion (glue) layer, a barrier layer, and/or a seed layer before depositing the conductor.

Method 1600 proceeds to operation 1608, as illustrated in FIG. 16A, in which an array of DRAM cells is formed above a second substrate. The second substrate can be a silicon substrate. In some embodiments, to form the array of DRAM cells, a plurality of transistors are formed on the second substrate, and a plurality of capacitors are formed above and in contact with the transistors. In some embodiments, a peripheral circuit of the array of DRAM cells is also formed on the second substrate.

As illustrated in FIG. 10A, a plurality of transistors 1004 are formed on a silicon substrate 1002. Transistors 1004 can be formed by a plurality of processes including, but not limited to, photolithography, dry/wet etch, thin film deposition, thermal growth, implantation, CMP, and any other suitable processes. In some embodiments, doped regions are formed in silicon substrate 1002 by ion implantation and/or thermal diffusion, which function, for example, as source and/or drain regions of transistors 1004. In some embodiments, isolation regions (e.g., STIs) are also formed in silicon substrate 1002 by wet/dry etch and thin film deposition.

As illustrated in FIG. 10B, a plurality of capacitors 1006 are formed above and in contact with transistors 1004, i.e., DRAM selection transistors 1004. Each capacitor 1006 can be patterned by photography to be aligned with respective DRAM selection transistor 1004 to form a 1T1C memory cell, for example, by electrically connecting one electrode of capacitor 1006 with one node of respective DRAM selection transistor 1004. In some embodiments, bit lines 1007 and common plates 1009 are formed as well for electrically connecting DRAM selection transistors 1004 and capacitors 1006. Capacitors 1006 can be formed by a plurality of processes including, but not limited to, photolithography, dry/wet etch, thin film deposition, thermal growth, implantation, CMP, and any other suitable processes. An array of DRAM cells 1008 (each having DRAM selection transistor 1004 and capacitor 1006) are thereby formed.

Method 1600 proceeds to operation 1610, as illustrated in FIG. 16A, in which a second interconnect layer is formed above the array of DRAM cells. The second interconnect layer can include a second plurality of interconnects in one or more ILD layers. As illustrated in FIG. 10C, an interconnect layer 1014 can be formed above array of DRAM cells 1008. Interconnect layer 1014 can include interconnects of MEOL and/or BEOL in a plurality of ILD layers to make electrical connections with array of DRAM cells 1008. In some embodiments, interconnect layer 1014 includes multiple ILD layers and interconnects therein formed in multiple processes. For example, the interconnects in interconnect layers 1014 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 10C can be collectively referred to as interconnect layer 1014.

Method 1600 proceeds to operation 1612, as illustrated in FIG. 16A, in which a second bonding layer is formed above the second interconnect layer. The second bonding layer can include a plurality of second bonding contacts. As illustrated in FIG. 10C, a bonding layer 1016 is formed above interconnect layer 1014. Bonding layer 1016 can include a plurality of bonding contacts 1018 surrounded by dielectrics. In some embodiments, a dielectric layer is deposited on the top surface of interconnect layer 1014 by one or more thin film deposition processes including, but not limited to, CVD, PVD, ALD, or any combination thereof. Bonding contacts 1018 then can be formed through the dielectric layer and in contact with the interconnects in interconnect layer 1014 by first patterning contact holes through the dielectric layer using a patterning process (e.g., photolithography and dry/wet etch of dielectric materials in the dielectric layer). The contact holes can be filled with a conductor (e.g., copper). In some embodiments, filling the contact holes includes depositing an adhesion (glue) layer, a barrier layer, and/or a seed layer before depositing the conductor.

Method 1600 proceeds to operation 1614, as illustrated in FIG. 16A, in which an array of SRAM cells is formed on a third substrate. The third substrate can be a silicon substrate. In some embodiments, to form the array of SRAM cells, a plurality of transistors are formed on the third substrate. In some embodiments, a peripheral circuit of at least one of the array of SRAM cells, the array of NAND memory cells, or the array of DRAM cells is also formed on the third substrate.

As illustrated in FIG. 8A, a plurality of transistors 804 are formed on a silicon substrate 802 by a plurality of processes including, but not limited to, photolithography, dry/wet etch, thin film deposition, thermal growth, implantation, CMP, and any other suitable processes. In some embodiments, doped regions are formed in silicon substrate 802 by ion implantation and/or thermal diffusion, which function, for example, as source regions and/or drain regions of transistors 804. In some embodiments, isolation regions (e.g., STIs) are also formed in silicon substrate 802 by wet/dry etch and thin film deposition. Transistors 804 can form a device layer 806 on silicon substrate 802. In some embodiments, device layer 806 includes an array of SRAM cells 803 and a peripheral circuit 805.

Method 1600 proceeds to operation 1616, as illustrated in FIG. 16B, in which a third interconnect layer is formed above the array of SRAM cells. The third interconnect layer can include a third plurality of interconnects in one or more ILD layers. As illustrated in FIG. 8B, an interconnect layer 814 can be formed above device layer 806 including array of SRAM cells 803. Interconnect layer 814 can include interconnects of MEOL and/or BEOL in a plurality of ILD layers to make electrical connections with device layer 806. In some embodiments, interconnect layer 814 includes multiple ILD layers and interconnects therein formed in multiple processes. For example, the interconnects in interconnect layer 814 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 8B can be collectively referred to as interconnect layer 814.

Method 1600 proceeds to operation 1618, as illustrated in FIG. 16B, in which a third bonding layer is formed above the third interconnect layer. The third bonding layer can include a plurality of third bonding contacts. As illustrated in FIG. 8B, a bonding layer 816 is formed above interconnect layer 814. Bonding layer 816 can include a plurality of bonding contacts 818 surrounded by dielectrics. In some embodiments, a dielectric layer is deposited on the top surface of interconnect layer 814 by one or more thin film deposition processes including, but not limited to, CVD, PVD, ALD, or any combination thereof. Bonding contacts 818 then can be formed through the dielectric layer and in contact with the interconnects in interconnect layer 814 by first patterning contact holes through the dielectric layer using a patterning process (e.g., photolithography and dry/wet etch of dielectric materials in the dielectric layer). The contact holes can be filled with a conductor (e.g., copper). In some embodiments, filling the contact holes includes depositing a barrier layer, an adhesion layer, and/or a seed layer before depositing the conductor.

Method 1600 proceeds to operation 1620, as illustrated in FIG. 16B, in which the third semiconductor structure and one of the first and second semiconductor structures are bonded in a face-to-face manner to form a bonded structure having a first bonding interface between the third bonding layer and one of the first and second bonding layers. In some embodiments, the one of the first and second semiconductor structures is above the third semiconductor structure in the bonded structure. In some embodiments, the third bonding contacts are in contact with one of the first and second bonding contacts at the first bonding interface. The bonding can be hybrid bonding. In some embodiments, the first and third semiconductor structures are bonded. In some embodiments, the second and third semiconductor structures are bonded.

As illustrated in FIG. 11A, silicon substrate 902 and components formed thereon (e.g., memory stack 904 and array of 3D NAND memory strings 910 formed therethrough) are flipped upside down. Bonding layer 922 facing down is bonded with bonding layer 816 facing up, i.e., in a face-to-face manner, thereby forming a first bonding interface 1102 (as shown in FIG. 11B). That is, silicon substrate 902 and components formed thereon can be bonded with silicon substrate 802 and components formed thereon in a face-to-face manner. In some embodiments, a treatment process, e.g., plasma treatment, wet treatment and/or thermal treatment, is applied to bonding surfaces prior to bonding. Although not shown in FIG. 11A, silicon substrate 1002 and components formed thereon (e.g., array of DRAM cells 1008) may be flipped upside down, and bonding layer 1016 facing down may be bonded with bonding layer 816 facing up, i.e., in a face-to-face manner in some other embodiments. After the bonding, bonding contacts 924 in bonding layer 922 and bonding contacts 818 in bonding layer 816 are aligned and in contact with one another, such that memory stack 904 and array of 3D NAND memory strings 910 formed therethrough can be electrically connected to device layer 806 (e.g., array of SRAM cells 803 and peripheral circuit 805 therein). First bonding interface 1102 can be formed between device layer 806 (e.g., array of SRAM cells 803 and peripheral circuit 805 therein) and memory stack 904 (and array of 3D NAND memory strings 910 formed therethrough) after the bonding as illustrated in FIG. 11B.

Method 1600 proceeds to operation 1622, as illustrated in FIG. 16B, in which the third substrate in the bonded structure is thinned to form a semiconductor layer. In some embodiments, a contact extending vertically through the thinned third substrate is formed to be in contact with the third interconnect layer.

As illustrated in FIG. 11B, silicon substrate 802 (as shown in FIG. 11A) after the bonding is thinned, so that thinned silicon substrate 802 can serve as a semiconductor layer 1104, for example, a single-crystal silicon layer. In one example, the thickness of semiconductor layer 1104 may be between about 1 μm and about 20 μm, such as between 1 μm and 20 μm (e.g., 1 μm, 2 μm, 3 μm, 4 μm, 5 μm, 6 μm, 7 μm, 8 μm, 9 μm, 10 μm, 15 μm, 20 μm, any range bounded by the lower end by any of these values, or in any range defined by any two of these values), for example, using a combination of etch and CMP processes. It is understood that in some embodiments, by further applying an additional etch process, the thickness of semiconductor layer 1104 may be further reduced to below 1 µm, e.g., in the sub-micron range. As illustrated in FIG. 11B, contacts 1107 extending vertically through semiconductor layer 1104 are formed using drying etching and/or wet, followed by one or more thin film, e.g., metal film, deposition processes including, but not limited to, CVD, PVD, ALD, or any combination thereof. Contacts 1107 formed thereby can be in contact with the interconnects in interconnect layer 814 to make electrical connections.

Method 1600 proceeds to operation 1624, as illustrated in FIG. 16B, in which a fourth bonding layer is formed on the thinned third substrate and in contact with the contact. The fourth bonding layer can include a plurality of fourth bonding contacts. In some embodiments, the third bonding layer and the fourth bonding layer are on both sides of the array of SRAM cells.

As illustrated in FIG. 11B, a bonding layer 1106 is formed on semiconductor layer 1104. Bonding layer 1106 can include a plurality of bonding contacts 1108 surrounded by dielectrics and in contact with contacts 1107 to make electrical connections with the interconnects in interconnect layer 814. Bonding layers 816 and 1106 are on both sides of device layer 806 including array of SRAM cells 803, according to some embodiments. In some embodiments, a dielectric layer is deposited on semiconductor layer 1104 by one or more thin film deposition processes including, but not limited to, CVD, PVD, ALD, or any combination thereof. Bonding contacts 1108 then can be formed through the dielectric layer and in contact with the interconnects in interconnect layer 814 by first patterning contact holes through the dielectric layer using a patterning process (e.g., photolithography and dry/wet etch of dielectric materials in the dielectric layer). The contact holes can be filled with a conductor (e.g., copper). In some embodiments, filling the contact holes includes depositing a barrier layer, an adhesion layer, and/or a seed layer before depositing the conductor.

Method 1600 proceeds to operation 1626, as illustrated in FIG. 16B, in which the bonded structure and another one of the first and second semiconductor structures are bonded in a face-to-face manner to form a second bonding interface between the fourth bonding layer and another one of the first and second bonding layers. In some embodiments, the bonded structure is above the another one of the first and second semiconductor structures after the bonding. In some embodiments, the fourth bonding contacts are in contact with one of the first and second bonding contacts at the second bonding interface. The bonding can be hybrid bonding. In some embodiments, the bonded structure and the first semiconductor structure are bonded. In some embodiments, the bonded structure and the second semiconductor structure are bonded.

As illustrated in FIG. 12A, bonding layer 1106 facing down is bonded with bonding layer 1016 above silicon substrate 1002 facing up, i.e., in a face-to-face manner, thereby forming a second bonding interface 1202 (as shown in FIG. 12B). That is, silicon substrate 902 and components formed thereon (i.e., the bonded structure in FIG. 11B) can be bonded with silicon substrate 1002 and components formed thereon (e.g., array of DRAM cells 1008) in a face-to-face manner. In some embodiments, a treatment process, e.g., plasma treatment, wet treatment and/or thermal treatment, is applied to bonding surfaces prior to bonding. After the bonding, bonding contacts 1108 in bonding layer 1106 and bonding contacts 1018 in bonding layer 1016 are aligned and in contact with one another, such that array of 3D NAND memory strings 910 and device layer 806 (e.g., array of SRAM cells 803 and peripheral circuit 805 therein) can be electrically connected to array of DRAM cells 1008. Second bonding interface 1202 can be formed between device layer 806 (e.g., array of SRAM cells 803 and peripheral circuit 805 therein) and array of DRAM cells 1008 after the bonding as illustrated in FIG. 12B.

Method 1600 proceeds to operation 1628, as illustrated in FIG. 16B, in which the first substrate or the second substrate is thinned to form another semiconductor layer. As illustrated in FIG. 11B, silicon substrate 902 at the top of the bonded chip (e.g., above silicon substrate 1002 as shown in FIG. 12A) after the bonding is thinned, so that thinned silicon substrate 902 can serve as a semiconductor layer 1204, for example, a single-crystal silicon layer. In one example, the thickness of semiconductor layer 1204 may be between about 1 µm and about 20 µm, such as between 1 µm and 20 µm (e.g., 1 µm, 2 µm, 3 µm, 4 µm, 5 µm, 6 µm, 7 µm, 8 µm, 9 µm, 10 µm, 15 µm, 20 µm, any range bounded by the lower end by any of these values, or in any range defined by any two of these values), for example, using a combination of etch and CMP processes. It is understood that in some embodiments, by further applying an additional etch process, the thickness of semiconductor layer 1204 may be further reduced to below 1 µm, e.g., in the sub-micron range. It is further understood that when silicon substrate 1002 is the substrate at the top of the bonded chip (e.g., above silicon substrate 902), another semiconductor layer may be formed by thinning silicon substrate 1002.

Method 1600 proceeds to operation 1630, as illustrated in FIG. 16B, in which a pad-out interconnect layer above the semiconductor layer. As illustrated in FIG. 12B, a pad-out interconnect layer 1206 is formed above semiconductor layer 1204. Pad-out interconnect layer 1206 can include interconnects, such as pad contacts 1208, formed in one or more ILD layers. Pad contacts 1208 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some embodiments, after the bonding and thinning, contacts 1210 are formed extending vertically through semiconductor layer 1204, for example, by wet/dry etching followed by depositing conductive materials. Contacts 1210 can be in contact with interconnects in pad-out interconnect layer 1206 and interconnect layer 920.

It is understood that although the semiconductor devices depicted in FIGS. 8A, 8B, 9A, 9B, 10A-10C, 11A, 11B, 12A, 12B, 16A, and 16B include 3D memory device 100 and 200 depicted in FIGS. 1 and 2, 3D memory devices 300 and 400 in FIGS. 3 and 4 may be implemented in the same vein as described above with respect to FIGS. 8A, 8B, 9A, 9B, 10A-10C, 11A, 11B, 12A, 12B, 16A, and 16B, which are not repeated herein.

Figure 13:
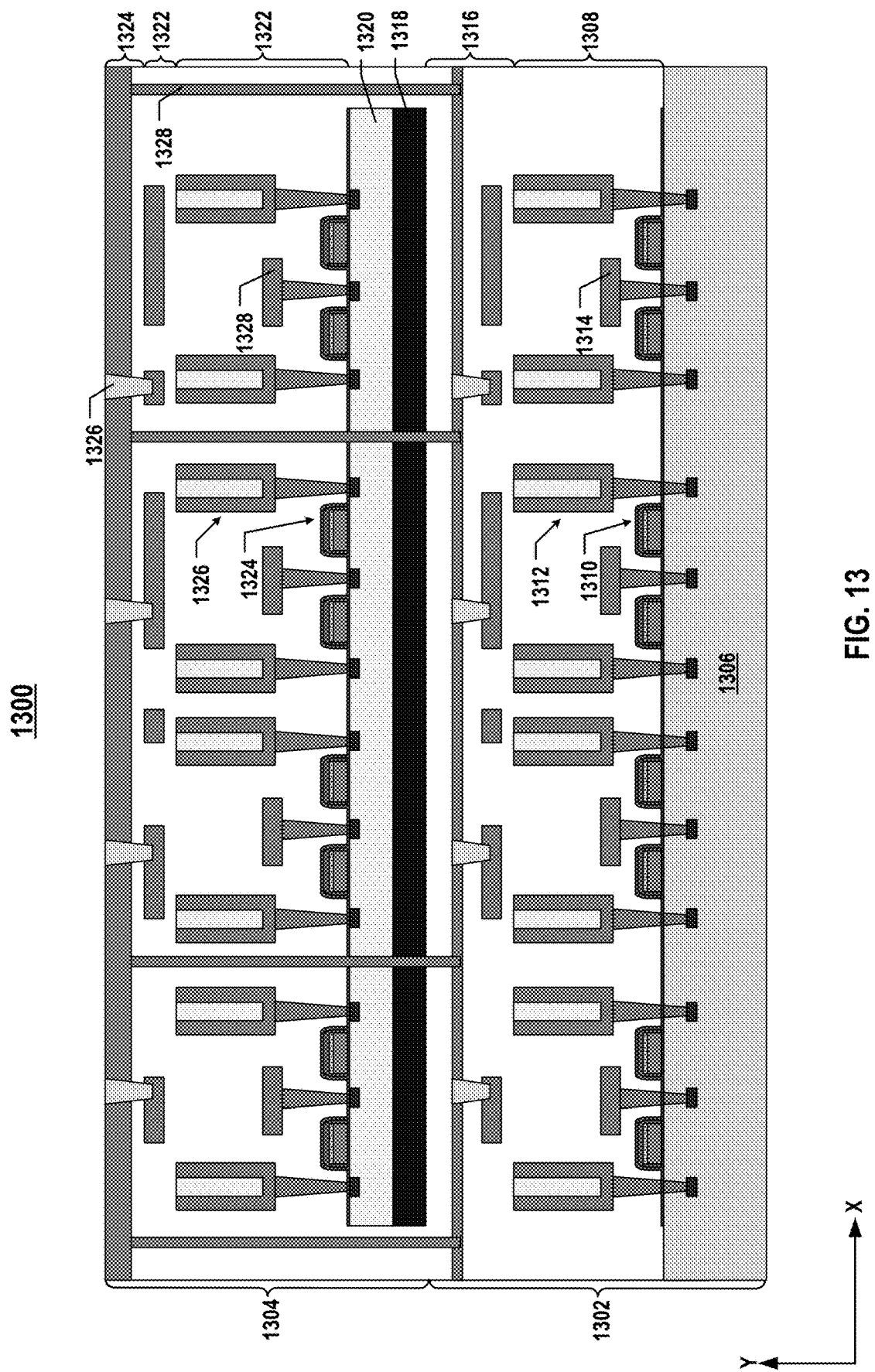
FIG. 13 illustrates a cross-section of an exemplary semiconductor structure having multi-stack DRAM cells, according to some embodiments.

It is understood that the DRAM disclosed herein may include multi-stack DRAM cells in some embodiments. For example, FIG. 13 illustrates a cross-section of an exemplary semiconductor structure 1300 having multi-stack DRAM cells, according to some embodiments. The details of similar structures (e.g., materials, fabrication process, functions, etc.) in both semiconductor structures 704 and 1300 including DRAM cells are not repeated. Semiconductor structure 1300 includes a first DRAM stack 1302 and a second DRAM stack 1304 above first DRAM stack 1302, according to some embodiments. As shown in FIG. 13, first DRAM stack 1302 can include a substrate 1306 and an array of DRAM cells 1308 above substrate 1306. In some embodiments, each DRAM cell 1308 includes a DRAM selection transistor 1310 formed on substrate 1306 and a capacitor 1312 above and in contact with DRAM selection transistor 1310. First DRAM stack 1302 can include bit lines 1314 in contact with DRAM selection transistors 1310 as well. First DRAM stack 1302 can also include an interconnect layer 1316 above array of DRAM cells 1308.

As shown in FIG. 13, second DRAM stack 1304 can include a silicide layer 1318 above interconnect layer 1316 and a polysilicon layer 1320 on silicide layer 1318. Silicide layer 1318 includes one or more layers of silicide materials, such as tungsten silicide, titanium silicide, cobalt silicide, or any combinations thereof, according to some embodiments. In some embodiments, polysilicon layer 1320 is doped to achieve a higher conductivity. In some embodiments, second DRAM stack 1304 further includes an array of DRAM cells 1322 above polysilicon layer 1320. In some embodiments, each DRAM cell 1322 includes a DRAM selection transistor 1324 formed on polysilicon layer 1320 and a capacitor 1326 above and in contact with DRAM selection transistor 1324. Second DRAM stack 1304 can include bit lines 1328 in contact with DRAM selection transistors 1324 as well. Second DRAM stack 1304 can also include an interconnect layer 1323 above array of DRAM cells 1308 and a bonding layer 1325 including bonding contacts 1327 above interconnect layer 1323. In some embodiments, semiconductor structure 1300 further include contacts 1328 extending vertically through silicide layer 1318 and polysilicon layer 1320 to electrically connect bonding layer 1325, interconnect layer 1323 of second DRAM stack 1304, and interconnect layer 1316 of first DRAM stack 1302.

Figure 14:
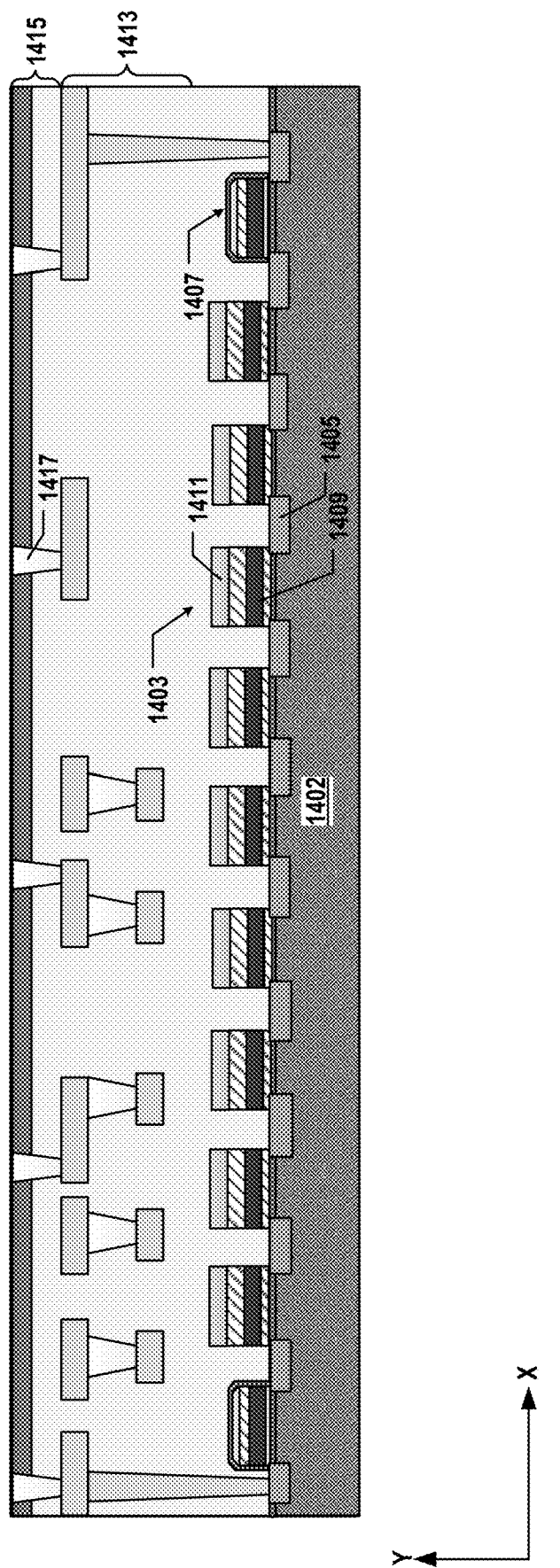
FIG. 14 illustrates a cross-section of an exemplary semiconductor structure having 2D NAND memory cells, according to some embodiments.

It is understood that the NAND memory disclosed herein may include an array of 2D NAND memory cells in addition to or instead of an array of 3D NAND memory strings in some embodiments. For example, FIG. 14 illustrates a cross-section of an exemplary semiconductor structure 1400 having 2D NAND memory cells, according to some embodiments. Semiconductor structure 1400 includes a NAND flash memory device in which memory cells are provided in the form of an array of 2D NAND memory cells 1403 on a substrate 1402. Array of 2D NAND memory cells 1403 can include a plurality of 2D NAND memory strings, each of which includes a plurality of memory cells connected in series by sources/drains 1405 (resembling a NAND gate) and two select transistors 1407 at the ends of the 2D NAND memory string, respectively. In some embodiments, each 2D NAND memory cell 1403 includes a floating-gate transistor having a floating gate 1409 and a control gate 1411 stacked vertically. In some embodiments, the floating-gate transistor further includes dielectric layers, such as a blocking layer disposed vertically between control gate 1411 and floating gate 1409 and a tunneling layer disposed below floating gate 1409. Channels can be formed laterally between sources/drains 1405 and below the gate stacks (including the tunneling layer, floating gate 1409, the blocking layer, and control gate 1411). Each channel is controlled by the voltage signal applied to the respective gate stack through control gate 1411, according to some embodiments. It is understood that 2D NAND memory cell 1403 may include a charge-trap transistor, which replaces floating gate 1409 with a storage layer.

In some embodiments, semiconductor structure 1400 also includes an interconnect layer 1413 above array of 2D NAND memory cells 1403 to transfer electrical signals to and from array of 2D NAND memory cells 1403. Interconnect layer 1413 can include a plurality of interconnects, including interconnect lines and via contacts. In some embodiments, interconnects in interconnect layer 1413 also include local interconnects, such as bit line contacts and word line contacts. In some embodiments, semiconductor structure 1400 further includes a bonding layer 1415 above interconnect layer 1413 and array of 2D NAND memory cells 1403. Bonding layer 1415 can include a plurality of bonding contacts 1417 and dielectrics surrounding and electrically isolating bonding contacts 1417.

It is understood that although the semiconductor structures disclosed above in which SRAM is formed (e.g., 706 and 707) each include the peripheral circuits of the SRAM, NAND memory and/or DRAM, in some embodiments, the entirety or part of the peripheral circuits may not be included in the semiconductor structure in the bonded semiconductor device. It is also understood that although the semiconductor structures disclosed above in which NAND memory is formed (e.g., 702 and 703) each does not include the peripheral circuits of the NAND memory, in some embodiments, the entirety or part of the peripheral circuits may be included in the semiconductor structure in the bonded semiconductor device. It is further understood that although the semiconductor structures disclosed above in which DRAM is formed (e.g., 704 and 705) each does not include the peripheral circuits of the DRAM, in some embodiments, the entirety or part of the peripheral circuits may be included in the semiconductor structure in the bonded semiconductor device.

Figure 15A:
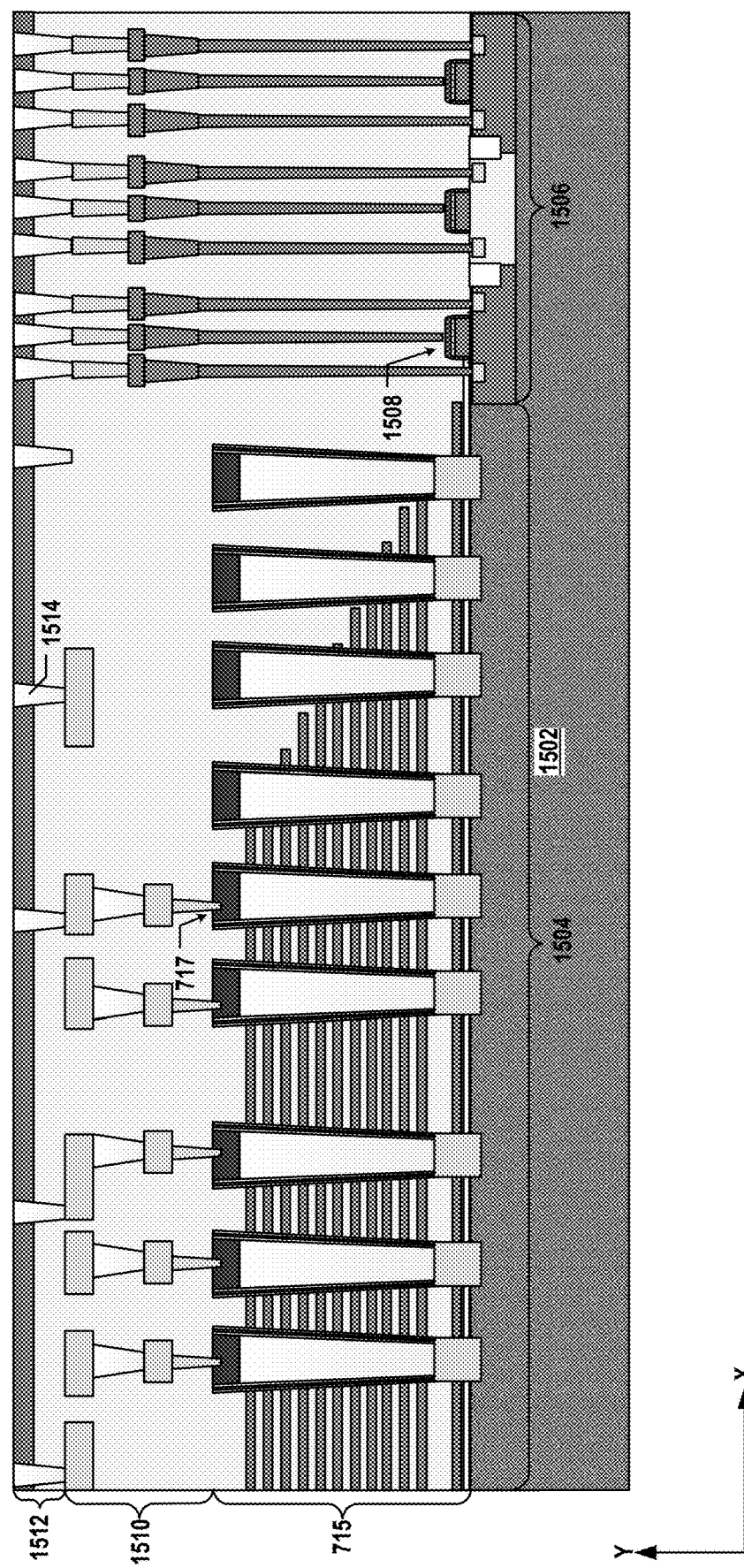
FIG. 15A illustrates a cross-section of an exemplary semiconductor structure having NAND memory and peripheral circuits, according to some embodiments.

For example, FIG. 15A illustrates a cross-section of an exemplary semiconductor structure 1500 having NAND memory and peripheral circuits, according to some embodiments. For illustrative purposes only, a NAND memory 1504 in semiconductor structure 1500 includes array of 3D NAND memory strings 717 extending vertically through memory stack 715 above a substrate 1502 as described above in detail in first semiconductor structure 703 with respect to FIG. 7B. The details of similar structures (e.g., materials, fabrication process, functions, etc.) in both semiconductor structures 703 and 1500 are not repeated. It is understood that NAND memory 1504 may include an array of 2D NAND memory cells (e.g., 1403) in other embodiments.

As illustrated in FIG. 15A, semiconductor structure 1500 further includes a peripheral circuit 1506 formed on substrate 1502 and outside of NAND memory 1504 (e.g., array of 3D NAND memory strings 717). Both NAND memory 1504 and peripheral circuit 1506 of NAND memory 1504 can be formed in the same plane, e.g., on substrate 1502. Peripheral circuit 1506 can be the entirety or part of the peripheral circuits for sensing and controlling NAND memory 1504, including one or more of a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). In some embodiments, peripheral circuit 1506 includes a plurality of transistors 1508. Transistors 1508 can be formed "on" substrate 1502, in which the entirety or part of transistors 1508 are formed in substrate 1502 (e.g., below the top surface of substrate 1502) and/or directly on substrate 1502. Isolation regions (e.g., STIs) and doped regions (e.g., source regions and drain regions of transistors 1508) can be formed in substrate 1502 as well. Transistors 1508 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some embodiments.

In some embodiments, semiconductor structure 1500 also includes an interconnect layer 1510 above NAND memory 1504 (e.g., memory stack 715, 3D NAND memory strings 717) and peripheral circuit 1506 to transfer electrical signals to and from 3D NAND memory strings 717 and peripheral circuit 1506. Interconnect layer 1510 can include a plurality of interconnects, including interconnect lines and via contacts. NAND memory 1504 (e.g., 3D NAND memory strings 717) and peripheral circuit 1506 can be electrically connected by interconnects in interconnect layer 1510 as well. In some embodiments, semiconductor structure 1500 further includes a bonding layer 1512 above interconnect layer 1510, memory stack 715 (and 3D NAND memory strings 717 therethrough), and peripheral circuit 1506. Bonding layer 1512 can include a plurality of bonding contacts 1514 and dielectrics surrounding and electrically isolating bonding contacts 1514.

Figure 15B:
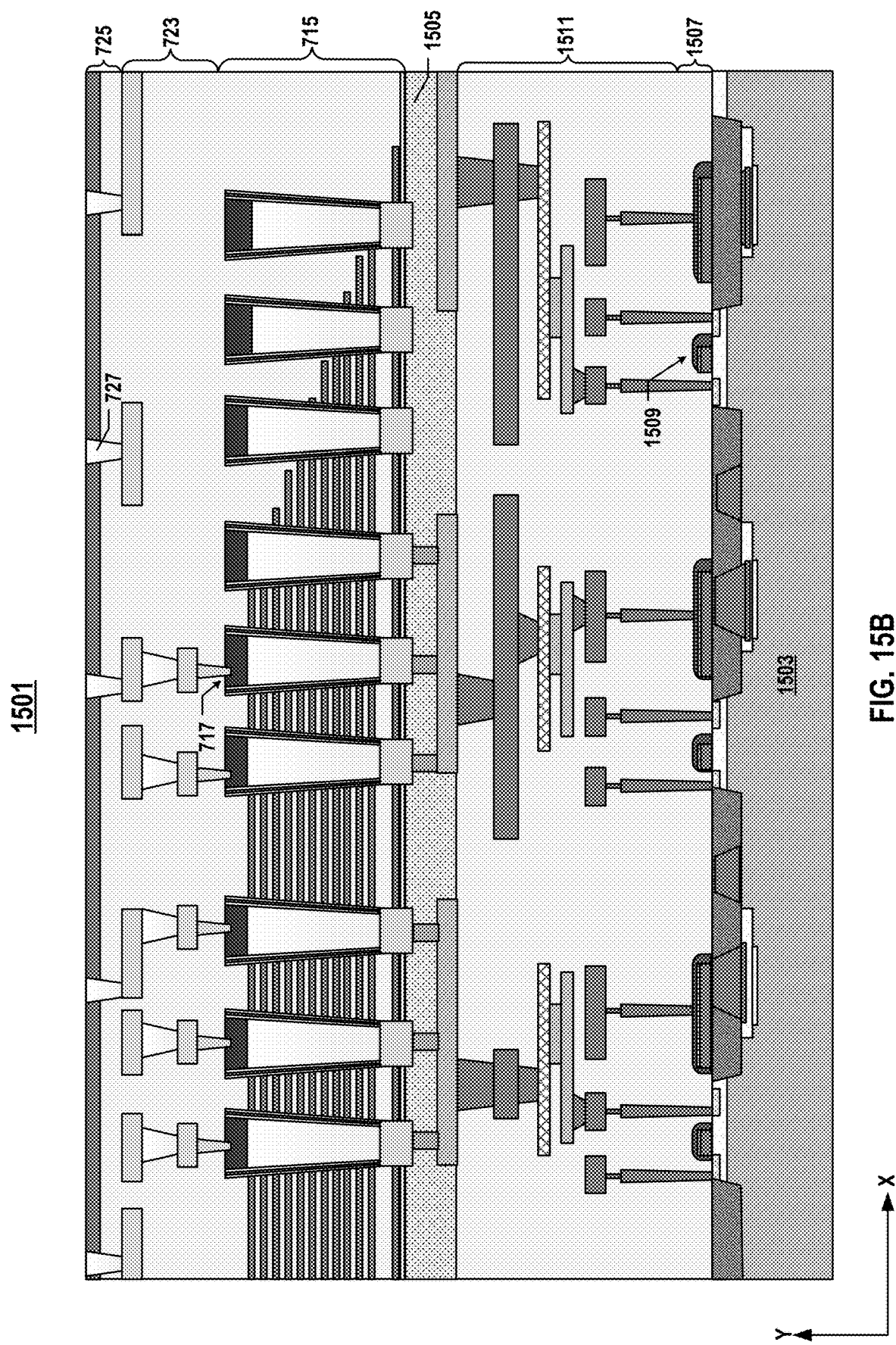
FIG. 15B illustrates a cross-section of another exemplary semiconductor structure having NAND memory and peripheral circuits, according to some embodiments.

The relative positions of the NAND memory and the peripheral circuit of the NAND memory in the same semiconductor structure are not limited to being in the same plane as shown in FIG. 15A. In some embodiments, the peripheral circuit of the NAND memory is above the NAND memory. In some embodiments, the peripheral circuit of the NAND memory is below the NAND memory. For example, FIG. 15B illustrates a cross-section of another exemplary semiconductor structure 1501 having NAND memory and peripheral circuits, according to some embodiments. Semiconductor structure 1501 is similar to semiconductor structure 703, both of which include memory stack 715, array of 3D NAND memory strings 717, interconnect layer 723 above memory stack 715, and bonding layer 725 above interconnect layer 723. The details of similar structures (e.g., materials, fabrication process, functions, etc.) in both semiconductor structures 703 and 1501 are thus not repeated.

Different from semiconductor structure 703, semiconductor structure 1501 further includes a peripheral circuit 1507 below memory stack 715 (and 3D NAND memory strings 717 therethrough) on a substrate 1503. Peripheral circuit 1507 can be the entirety or part of the peripheral circuits for sensing and controlling 3D NAND memory strings 717, including one or more of a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). In some embodiments, peripheral circuit 1507 includes a plurality of transistors 1509. Transistors 1509 can be formed "on" substrate 1503, in which the entirety or part of transistors 1509 are formed in substrate 1503 (e.g., below the top surface of substrate 1503) and/or directly on substrate 1503. Isolation regions (e.g., STIs) and doped regions (e.g., source regions and drain regions of transistors 1509) can be formed in substrate 1503 as well. Transistors 1509 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some embodiments.

In some embodiments, semiconductor structure 1501 also includes an interconnect layer 1511 formed vertically between peripheral circuit 1507 and memory stack 715 (and 3D NAND memory strings 717 therethrough) to electrically connect 3D NAND memory strings 717 and peripheral circuit 1507 for transferring electrical signals between 3D NAND memory strings 717 and peripheral circuit 1507. Interconnect layer 1511 can include a plurality of interconnects, including interconnect lines and via contacts. 3D NAND memory strings 717 and peripheral circuit 1507 can be electrically connected by the interconnects in interconnect layer 1511 as well. In some embodiments, semiconductor structure 1501 further includes a semiconductor layer 1505 above which memory stack 715 (and 3D NAND memory strings 717 therethrough) can be formed. Semiconductor layer 1505 can be a polysilicon layer formed above interconnect layer 1511, for example, by one or more thin film deposition processes. Memory stack 715 then can be formed above semiconductor layer 1505. It is understood that although peripheral circuit 1507 is below memory stack 715 (and 3D NAND memory strings 717 therethrough) as shown in FIG. 15B, in some embodiments, peripheral circuit 1507 may be above memory stack 715 (and 3D NAND memory strings 717 therethrough).

Although semiconductor structures 1500 and 1501 in FIGS. 15A and 15B include NAND flash memory, it is understood that semiconductor structures including DRAM may have similar configurations as semiconductor structures 1500 and 1501. For example, semiconductor structure including DRAM as disclosed herein (e.g., 704 and 705) may include the entirety or part of the peripheral circuits of DRAM cells as well. The peripheral circuit of DRAM cells can be in the same plane as the DRAM cells (e.g., outside of the DRAM cell array), above the DRAM cell array, and/or below the DRAM cell array.

According to one aspect of the present disclosure, a 3D memory device includes a first semiconductor structure including an array of NAND memory cells and a first bonding layer including a plurality of first bonding contacts. The 3D memory device also includes a second semiconductor structure including an array of DRAM cells and a second bonding layer including a plurality of second bonding contacts. The 3D memory device also includes a third semiconductor structure including an array of static random-access memory (SRAM) cells, a third bonding layer including a plurality of third bonding contacts, and a fourth bonding layer including a plurality of fourth bonding contacts. The third bonding layer and the fourth bonding layer are on both sides of the array of SRAM cells. The 3D memory device further includes a first bonding interface between the first bonding layer and the third bonding layer. The first bonding contacts are in contact with the third bonding contacts at the first bonding interface. The 3D memory device further includes a second bonding interface between the second bonding layer and the fourth bonding layer. The second bonding contacts are in contact with the fourth bonding contacts at the second bonding interface.

In some embodiments, the second semiconductor structure includes a substrate, the array of DRAM cells above the substrate, and the second bonding layer above the array of DRAM cells.

In some embodiments, the third semiconductor structure includes the fourth bonding layer above the second bonding layer, the array of SRAM cells above the fourth bonding layer, and the third bonding layer above the array of SRAM cells.

In some embodiments, the first semiconductor structure includes the first bonding layer above the third bonding layer, the array of NAND memory cells above the first bonding layer, and a semiconductor layer above and in contact with the array of NAND memory cells. In some embodiments, the array of NAND memory cells includes at least one of a 3D NAND memory string or a 2D NAND memory cell.

In some embodiments, the semiconductor structure further includes a pad-out interconnect layer above the semiconductor layer. In some embodiments, the semiconductor layer includes single-crystal silicon. In some embodiments, the semiconductor layer includes polysilicon.

In some embodiments, the first semiconductor structure includes a substrate, the array of NAND memory cells above the substrate, and the first bonding layer above the array of NAND memory cells. In some embodiments, the array of NAND memory cells includes at least one of a 3D NAND memory string or a 2D NAND memory cell.

In some embodiments, the third semiconductor structure includes the third bonding layer above the first bonding layer, the array of SRAM cells above the third bonding layer, and the fourth bonding layer above the array of SRAM cells.

In some embodiments, the second semiconductor structure includes the second bonding layer above the fourth bonding layer, the array of DRAM cells above the second bonding layer, and a semiconductor layer above and in contact with the array of DRAM cells.

In some embodiments, the semiconductor structure further includes a pad-out interconnect layer above the semiconductor layer. In some embodiments, the semiconductor layer includes single-crystal silicon.

In some embodiments, at least one of the first, second, and third semiconductor structures further includes a peripheral circuit.

In some embodiments, the first semiconductor structure includes a first interconnect layer vertically between the first bonding layer and the array of NAND memory cells, and the second semiconductor structure includes a second interconnect layer vertically between the second bonding layer and the array of DRAM cells.

In some embodiments, the array of SRAM cells is electrically connected to the array of NAND memory cells through the first interconnect layer and the first and third bonding contacts, and the array of SRAM cells is electrically connected to the array of DRAM cells through the second interconnect layer and the second and fourth bonding contacts. In some embodiments, the array of NAND memory cells is electrically connected to the array of DRAM cells through the first and second interconnect layers and the first, second, third, and fourth bonding contacts.

In some embodiments, the 3D memory device does not include a processor.

According to another aspect of the present disclosure, a 3D memory device includes a first semiconductor structure including an array of SRAM cells and a first bonding layer including a plurality of first bonding contacts. The 3D memory device also includes a second semiconductor structure including an array of DRAM cells and a second bonding layer including a plurality of second bonding contacts. The 3D memory device also includes a third semiconductor structure including an array of NAND memory cells, a third bonding layer including a plurality of third bonding contacts, and a fourth bonding layer including a plurality of fourth bonding contacts. The third bonding layer and the fourth bonding layer are on both sides of the array of NAND memory cells. The 3D memory device further includes a first bonding interface between the first bonding layer and the third bonding layer. The first bonding contacts are in contact with the third bonding contacts at the first bonding interface. The 3D memory device further includes a second bonding interface between the second bonding layer and the fourth bonding layer. The second bonding contacts are in contact with the fourth bonding contacts at the second bonding interface.

In some embodiments, the second semiconductor structure includes a substrate, the array of DRAM cells above the substrate, and the second bonding layer above the array of DRAM cells.

In some embodiments, the third semiconductor structure includes the fourth bonding layer above the second bonding layer, the array of NAND memory cells above the fourth bonding layer, and the third bonding layer above the array of NAND memory cells.

In some embodiments, the first semiconductor structure includes the first bonding layer above the third bonding layer, the array of SRAM cells above the first bonding layer, and a semiconductor layer above and in contact with the array of SRAM cells.

In some embodiments, the semiconductor structure further includes a pad-out interconnect layer above the semiconductor layer.

In some embodiments, the first semiconductor structure includes a substrate, the array of SRAM cells above the substrate, and the first bonding layer above the array of SRAM cells.

In some embodiments, the third semiconductor structure includes the third bonding layer above the first bonding layer, the array of NAND memory cells above the third bonding layer, and the fourth bonding layer above the array of NAND memory cells.

In some embodiments, the second semiconductor structure includes the second bonding layer above the fourth bonding layer, the array of DRAM cells above the second bonding layer, and a semiconductor layer above and in contact with the array of DRAM cells.

In some embodiments, the semiconductor structure further includes a pad-out interconnect layer above the semiconductor layer.

In some embodiments, at least one of the first, second, and third semiconductor structures further includes a peripheral circuit.

In some embodiments, the 3D memory device does not include a processor.

According to still another aspect of the present disclosure, a method for forming a 3D memory device is disclosed. A first semiconductor structure including an array of NAND memory cells and a first bonding layer including a plurality of first bonding contacts is formed. A second semiconductor structure including an array of DRAM cells and a second bonding layer including a plurality of second bonding contacts is formed. A third semiconductor structure including an array of SRAM cells and a third bonding layer including a plurality of third bonding contacts is formed. The third semiconductor structure and one of the first and second semiconductor structures are bonded in a face-to-face manner to form a bonded structure having a first bonding interface between the third bonding layer and one of the first and second bonding layers. A fourth bonding layer including a plurality of fourth bonding contacts is formed in the third semiconductor structure. The third bonding layer and the fourth bonding layer are on both sides of the array of SRAM cells. The bonded structure and another one of the first and second semiconductor structures are bonded in a face-to-face manner to form a second bonding interface between the fourth bonding layer and another one of the first and second bonding layers.

In some embodiments, to form the first semiconductor structure, the array of NAND memory cells is formed above a first substrate, a first interconnect layer is formed above the array of NAND memory cells, and the first bonding layer is formed above the first interconnect layer. In some embodiments, to form the first semiconductor structure, a peripheral circuit is formed on the first substrate.

In some embodiments, to form the second semiconductor structure, the array of DRAM cells is formed above a second substrate, a second interconnect layer is formed above the array of DRAM cells, and the second bonding layer is formed above the second interconnect layer. In some embodiments, to form the second semiconductor structure, a peripheral circuit is formed on the second substrate.

In some embodiments, to form the third semiconductor structure, the array of SRAM cells is formed on a third substrate, a third interconnect layer is formed above the array of SRAM cells, and the third bonding layer is formed above the third interconnect layer.

In some embodiments, the third substrate is thinned after bonding the third semiconductor structure and one of the first and second semiconductor structures, a contact extending vertically through the thinned third substrate is formed to be in contact with the third interconnect layer, and the fourth bonding layer is formed on the thinned third substrate and in contact with the contact.

In some embodiments, the first semiconductor structure is above the second semiconductor structure after bonding the bonded structure and another one of the first and second semiconductor structures. In some embodiments, the first substrate is thinned to form a semiconductor layer after bonding the bonded structure and another one of the first and second semiconductor structures, and a pad-out interconnect layer is formed above the semiconductor layer.

In some embodiments, the first semiconductor structure is below the second semiconductor structure after bonding the bonded structure and another one of the first and second semiconductor structures. In some embodiments, the second substrate is thinned to form a semiconductor layer after bonding the bonded structure and another one of the first and second semiconductor structures, and a pad-out interconnect layer is formed above the semiconductor layer.

In some embodiments, the bonding includes hybrid bonding.

According to yet another aspect of the present disclosure, a method for forming a 3D memory device is disclosed. A first semiconductor structure including an array of SRAM cells and a first bonding layer including a plurality of first bonding contacts is formed. A second semiconductor structure including an array of DRAM cells and a second bonding layer including a plurality of second bonding contacts is formed. A third semiconductor structure including an array of NAND memory cells and a third bonding layer including a plurality of third bonding contacts is formed. The third semiconductor structure and one of the first and second semiconductor structures are bonded in a face-to-face manner to form a bonded structure having a first bonding interface between the third bonding layer and one of the first and second bonding layers. A fourth bonding layer including a plurality of fourth bonding contacts is formed in the third semiconductor structure. The third bonding layer and the fourth bonding layer are on both sides of the array of NAND memory cells. The bonded structure and another one of the first and second semiconductor structures are bonded in a face-to-face manner to form a second bonding interface between the fourth bonding layer and another one of the first and second bonding layers.

In some embodiments, to form the first semiconductor structure, the array of SRAM cells is formed above a first substrate, a first interconnect layer is formed above the array of SRAM cells, and the first bonding layer is formed above the first interconnect layer.

In some embodiments, to form the second semiconductor structure, the array of DRAM cells is formed above a second substrate, a second interconnect layer is formed above the array of DRAM cells, and the second bonding layer is formed above the second interconnect layer.

In some embodiments, to form the third semiconductor structure, the array of NAND memory cells is formed on a third substrate, a third interconnect layer is formed above the array of NAND memory cells, and the third bonding layer is formed above the third interconnect layer.

In some embodiments, the third substrate is thinned after bonding the third semiconductor structure and one of the first and second semiconductor structures, a contact extending vertically through the thinned third substrate is formed to be in contact with the third interconnect layer, and the fourth bonding layer is formed on the thinned third substrate and in contact with the contact.

In some embodiments, the first semiconductor structure is above the second semiconductor structure after bonding the bonded structure and another one of the first and second semiconductor structures. In some embodiments, the first substrate is thinned to form a semiconductor layer after bonding the bonded structure and another one of the first and second semiconductor structures, and a pad-out interconnect layer is formed above the semiconductor layer.

In some embodiments, the first semiconductor structure is below the second semiconductor structure after bonding the bonded structure and another one of the first and second semiconductor structures. In some embodiments, the second substrate is thinned to form a semiconductor layer after bonding the bonded structure and another one of the first and second semiconductor structures, and a pad-out interconnect layer is formed above the semiconductor layer.

In some embodiments, the bonding includes hybrid bonding.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a first semiconductor structure comprising an array of NAND memory cells and a first bonding layer comprising a plurality of first bonding contacts;
a second semiconductor structure comprising an array of dynamic random-access memory (DRAM) cells and a second bonding layer comprising a plurality of second bonding contacts;
a third semiconductor structure comprising an array of static random-access memory (SRAM) cells, a third bonding layer comprising a plurality of third bonding contacts, and a fourth bonding layer comprising a plurality of fourth bonding contacts, wherein the third bonding layer and the fourth bonding layer are on both sides of the array of SRAM cells;
a first bonding interface between the first bonding layer and the third bonding layer, the first bonding contacts being in contact with the third bonding contacts at the first bonding interface; and
a second bonding interface between the second bonding layer and the fourth bonding layer, the second bonding contacts being in contact with the fourth bonding contacts at the second bonding interface.

2. The 3D memory device of claim 1, wherein the second semiconductor structure comprises:
a substrate;
the array of DRAM cells above the substrate; and
the second bonding layer above the array of DRAM cells.

3. The 3D memory device of claim 2, wherein the third semiconductor structure comprises:
the fourth bonding layer above the second bonding layer;
the array of SRAM cells above the fourth bonding layer; and
the third bonding layer above the array of SRAM cells.

4. The 3D memory device of claim 3, wherein the first semiconductor structure comprises:
the first bonding layer above the third bonding layer;
the array of NAND memory cells above the first bonding layer; and
a semiconductor layer above and in contact with the array of NAND memory cells.

5. The 3D memory device of claim 4, further comprising a pad-out interconnect layer above the semiconductor layer.

6. The 3D memory device of claim 1, wherein the first semiconductor structure comprises:
a substrate;
the array of NAND memory cells above the substrate; and
the first bonding layer above the array of NAND memory cells.

7. The 3D memory device of claim 6, wherein the third semiconductor structure comprises:
the third bonding layer above the first bonding layer;
the array of SRAM cells above the third bonding layer; and
the fourth bonding layer above the array of SRAM cells.

8. The 3D memory device of claim 7, wherein the second semiconductor structure comprises:
the second bonding layer above the fourth bonding layer;
the array of DRAM cells above the second bonding layer; and
a semiconductor layer above and in contact with the array of DRAM cells.

9. The 3D memory device of claim 8, further comprising a pad-out interconnect layer above the semiconductor layer.

10. The 3D memory device of claim 1, wherein
the first semiconductor structure comprises a first interconnect layer vertically between the first bonding layer and the array of NAND memory cells;
the second semiconductor structure comprises a second interconnect layer vertically between the second bonding layer and the array of DRAM cells;
the array of SRAM cells is electrically connected to the array of NAND memory cells through the first interconnect layer and the first and third bonding contacts; and
the array of SRAM cells is electrically connected to the array of DRAM cells through the second interconnect layer and the second and fourth bonding contacts.

11. The 3D memory device of claim 10, wherein the array of NAND memory cells is electrically connected to the array of DRAM cells through the first and second interconnect layers and the first, second, third, and fourth bonding contacts.

12. A three-dimensional (3D) memory device, comprising:
a first semiconductor structure comprising an array of static random-access memory (SRAM) cells and a first bonding layer comprising a plurality of first bonding contacts;
a second semiconductor structure comprising an array of dynamic random-access memory (DRAM) cells and a second bonding layer comprising a plurality of second bonding contacts;
a third semiconductor structure comprising an array of NAND memory cells, a third bonding layer comprising a plurality of third bonding contacts, and a fourth bonding layer comprising a plurality of fourth bonding contacts, wherein the third bonding layer and the fourth bonding layer are on both sides of the array of NAND memory cells;
a first bonding interface between the first bonding layer and the third bonding layer, the first bonding contacts being in contact with the third bonding contacts at the first bonding interface; and
a second bonding interface between the second bonding layer and the fourth bonding layer, the second bonding contacts being in contact with the fourth bonding contacts at the second bonding interface.

13. A method for forming a three-dimensional (3D) memory device, comprising:
forming a first semiconductor structure comprising an array of NAND memory cells and a first bonding layer comprising a plurality of first bonding contacts;
forming a second semiconductor structure comprising an array of dynamic random-access memory (DRAM) cells and a second bonding layer comprising a plurality of second bonding contacts;
forming a third semiconductor structure comprising an array of static random-access memory (SRAM) cells and a third bonding layer comprising a plurality of third bonding contacts;
bonding the third semiconductor structure and one of the first and second semiconductor structures in a face-to-face manner to form a bonded structure having a first bonding interface between the third bonding layer and one of the first and second bonding layers;
forming a fourth bonding layer comprising a plurality of fourth bonding contacts in the third semiconductor structure, wherein the third bonding layer and the fourth bonding layer are on both sides of the array of SRAM cells; and bonding the bonded structure and another one of the first and second semiconductor structures in a face-to-face manner to form a second bonding interface between the fourth bonding layer and another one of the first and second bonding layers.

14. The method of claim 13, wherein forming the first semiconductor structure comprises:
   forming the array of NAND memory cells above a first substrate;
   forming a first interconnect layer above the array of NAND memory cells; and
   forming the first bonding layer above the first interconnect layer.

15. The method of claim 13, wherein forming the second semiconductor structure comprises:
   forming the array of DRAM cells above a second substrate;
   forming a second interconnect layer above the array of DRAM cells; and
   forming the second bonding layer above the second interconnect layer.

16. The method of claim 13, wherein forming the third semiconductor structure comprises:
   forming the array of SRAM cells on a third substrate;
   forming a third interconnect layer above the array of SRAM cells; and
   forming the third bonding layer above the third interconnect layer.

17. The method of 16, further comprising:
   thinning the third substrate after bonding the third semiconductor structure and one of the first and second semiconductor structures;
   forming a contact extending vertically through the thinned third substrate to be in contact with the third interconnect layer; and
   forming the fourth bonding layer on the thinned third substrate and in contact with the contact.

18. The method of claim 13, wherein
   the first semiconductor structure is above the second semiconductor structure after bonding the bonded structure and another one of the first and second semiconductor structures; and
   the method further comprises:
      thinning the first substrate to form a semiconductor layer after bonding the bonded structure and another one of the first and second semiconductor structures; and
      forming a pad-out interconnect layer above the semiconductor layer.

19. The method of claim 13, wherein
   the first semiconductor structure is below the second semiconductor structure after bonding the bonded structure and another one of the first and second semiconductor structures; and
   the method further comprises:
      thinning the second substrate to form a semiconductor layer after bonding the bonded structure and another one of the first and second semiconductor structures; and
      forming a pad-out interconnect layer above the semiconductor layer.

20. The method of claim 13, wherein the bonding comprises hybrid bonding.

* * * * *